(12) United States Patent
Zhang

(10) Patent No.: US 10,720,938 B2
(45) Date of Patent: Jul. 21, 2020

(54) SEGMENTED DIGITAL-TO-ANALOG CONVERTER

(71) Applicant: Texas Instruments Incorporated, Dallas, TX (US)

(72) Inventor: Jun Zhang, Shanghai (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/276,025

(22) Filed: Feb. 14, 2019

(65) Prior Publication Data

US 2019/0181879 A1    Jun. 13, 2019

Related U.S. Application Data

(63) Continuation of application No. 16/023,816, filed on Jun. 29, 2018, now Pat. No. 10,250,276, which is a continuation of application No. 15/790,986, filed on Oct. 23, 2017, now Pat. No. 10,020,817, which is a continuation of application No. PCT/CN2017/089299, filed on Jun. 21, 2017.

(51) Int. Cl.
| | | |
|---|---|---|
| H03M 3/00 | (2006.01) | |
| H03M 1/06 | (2006.01) | |
| H03M 1/10 | (2006.01) | |
| H03M 1/66 | (2006.01) | |
| H03M 1/68 | (2006.01) | |
| H03M 1/78 | (2006.01) | |

(52) U.S. Cl.
CPC .............. *H03M 3/38* (2013.01); *H03M 1/066* (2013.01); *H03M 1/1061* (2013.01); *H03M 1/661* (2013.01); *H03M 3/34* (2013.01); *H03M 3/502* (2013.01); *H03M 1/66* (2013.01); *H03M 1/68* (2013.01); *H03M 1/785* (2013.01)

(58) Field of Classification Search
CPC .......... H03M 3/38; H03M 3/34; H03M 1/661; H03M 1/1061; H03M 1/066; H03M 3/502
USPC .................................................. 341/144, 120
See application file for complete search history.

(56) References Cited

U.S. PATENT DOCUMENTS

| | | |
|---|---|---|
| 5,396,245 A | 3/1995 | Rempfer |
| 5,525,986 A | 6/1996 | Kovacs |
| 5,977,898 A | 11/1999 | Ling et al. |

(Continued)

FOREIGN PATENT DOCUMENTS

CN    101877590 A    11/2010

OTHER PUBLICATIONS

Fogleman et al., "A Dynamic Element Matching Technique for Reduced-Distortion Multibit Quantization in Delta-Sigma ADCS", IEEE International Symposium on Circuits and Systems, 1999, IEEE, 4 pages.

(Continued)

*Primary Examiner* — Brian K Young
(74) *Attorney, Agent, or Firm* — Ebby Abraham; Charles A. Brill; Frank D. Cimino

(57) ABSTRACT

Disclosed examples include a segmented DAC circuit, including an R-2R resistor DAC to convert a first subword to a first analog output signal, an interpolation DAC to offset the first analog output signal based on an N-bit digital interpolation code signal to provide the analog output signal, and a Sigma Delta modulator to modulate a modulator code to provide the N-bit digital interpolation code signal that represents a value of second and third subwords.

7 Claims, 33 Drawing Sheets

(56) References Cited

U.S. PATENT DOCUMENTS

| | | |
|---|---|---|
| 5,999,115 A | 12/1999 | Connell et al. |
| 6,130,634 A | 10/2000 | Wadsworth et al. |
| 6,246,351 B1 | 6/2001 | Yilmaz |
| 6,448,917 B1 | 9/2002 | Leung et al. |
| 6,489,905 B1 | 12/2002 | Lee et al. |
| 6,617,989 B2 | 9/2003 | Deak |
| 6,621,439 B1 | 9/2003 | Bugeja |
| 6,707,404 B1 | 3/2004 | Yilmaz |
| 6,781,536 B1 | 8/2004 | Martins |
| 6,897,794 B2 | 5/2005 | Kuyel et al. |
| 6,970,122 B1 | 11/2005 | Yilmaz et al. |
| 7,283,082 B1 | 10/2007 | Kuyel |
| 7,522,083 B2 | 4/2009 | Sahara et al. |
| 7,675,450 B1 | 3/2010 | Tabatabaei et al. |
| 7,710,300 B2 | 5/2010 | Kwan |
| 7,796,060 B2 | 9/2010 | Oberhuber et al. |
| 8,134,486 B2 | 3/2012 | Lai et al. |
| 8,188,899 B2* | 5/2012 | Motamed .............. H03M 1/682 341/144 |
| 8,212,703 B2* | 7/2012 | Katsis .................... H03M 1/70 341/118 |
| 8,274,417 B2 | 9/2012 | Zhao et al. |
| 8,476,971 B2* | 7/2013 | Peng .................... G09G 3/3688 327/560 |
| 8,576,101 B1 | 11/2013 | Lin |
| 8,618,971 B1 | 12/2013 | Li |
| 9,178,524 B1* | 11/2015 | Lee ...................... H03M 1/0612 |
| 9,300,318 B1 | 3/2016 | Medina Sanchez-Castro |
| 10,020,817 B1 | 7/2018 | Zhang |
| 10,250,276 B2* | 4/2019 | Zhang ................... H03M 3/502 |
| 10,340,941 B1 | 7/2019 | Nandi |
| 2003/0117307 A1 | 6/2003 | Deak |
| 2005/0146452 A1 | 7/2005 | Kuyel |
| 2008/0100489 A1 | 5/2008 | Trifonov et al. |
| 2011/0102226 A1 | 5/2011 | Cosgrave |

OTHER PUBLICATIONS

Shagun Bajaoria, "Precision Current Mirror", Jul. 2010, Delft University of Technology, Master of Science Thesis, 99 pages.

International Search Report and Written Opinion, PCT/CN2017/089299, dated Mar. 27, 2018 (10 pages).

Notification of Transmittal of the International Search Report and the Written Opinion of the International Searching Authority, or the Declaration International application No. PCT/CN2017/1177; dated Sep. 13, 2018; 8 pages.

* cited by examiner

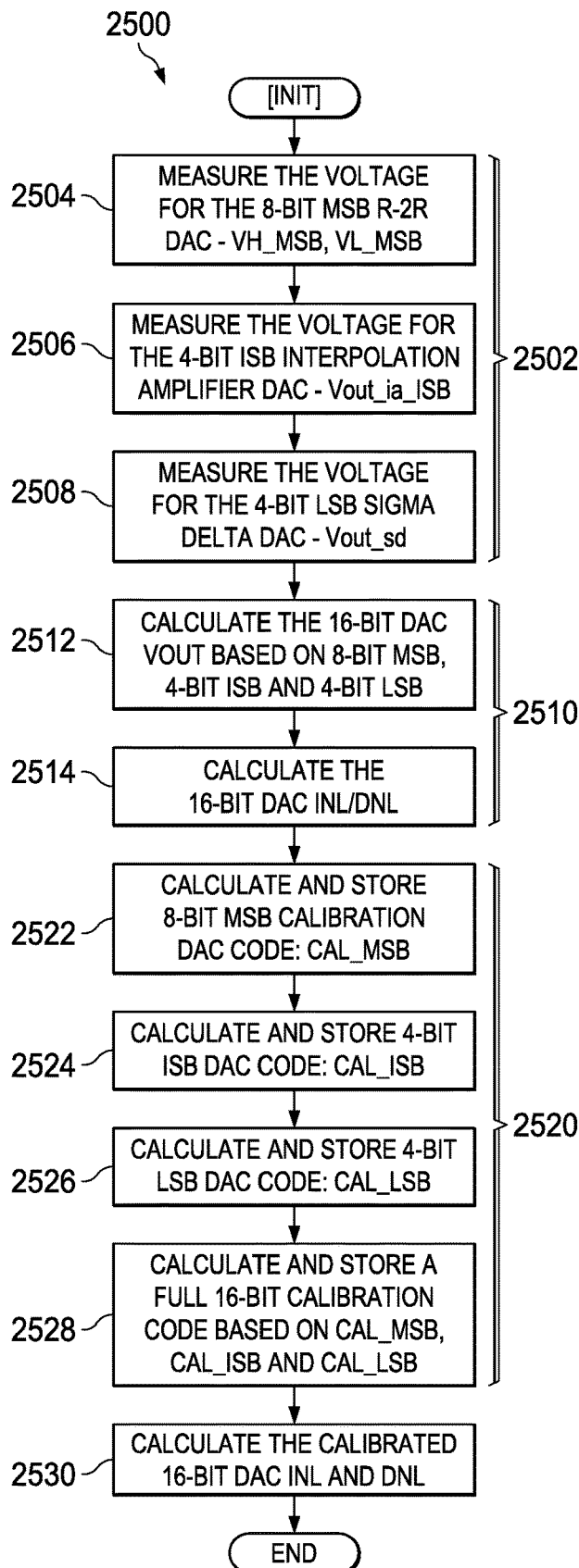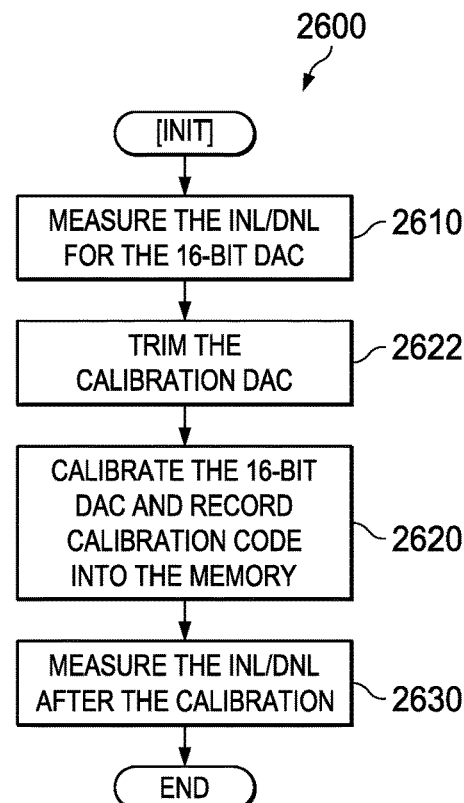
FIG. 25
FIG. 26

| dac<15> | dac<14> | dac<13> | dac<12> | dac<11> | dac<10> | dac<9> | dac<8> | VH | VL | VH_VL_ideal |
|---|---|---|---|---|---|---|---|---|---|---|
| 0 | 0 | 0 | 0 | 0 | 0 | 0 | 0 | 0.012511097 | 0.01248532 | 0.0125 |
| 0 | 0 | 0 | 0 | 0 | 0 | 0 | 1 | 0.012510847 | 0.012492675 | 0.0125 |
| 0 | 0 | 0 | 0 | 0 | 0 | 1 | 0 | 0.025023242 | 0.02498 | 0.025 |
| 0 | 0 | 0 | 0 | 0 | 1 | 0 | 0 | 0.050023097 | 0.049984413 | 0.05 |
| 0 | 0 | 0 | 0 | 1 | 0 | 0 | 0 | 0.100018671 | 0.099992746 | 0.1 |
| 0 | 0 | 0 | 1 | 0 | 0 | 0 | 0 | 0.200012006 | 0.199871434 | 0.2 |
| 0 | 0 | 1 | 0 | 0 | 0 | 0 | 0 | 0.400110296 | 0.399779774 | 0.4 |
| 0 | 1 | 0 | 0 | 0 | 0 | 0 | 0 | 0.799535414 | 0.800237608 | 0.8 |
| 1 | 0 | 0 | 0 | 0 | 0 | 0 | 0 | 1.600260229 | 1.600174707 | 1.6 |

MEASURE THE MSB VOLTAGE FOR VH_MSB AND VL_MSB

MEASURE THE 4lSB VOLTAGE VOUT_IA_lSB

| dac<7> | dac<6> | dac<5> | dac<4> | Vout chop0 | Vout chop1 | Vout_ideal |
|---|---|---|---|---|---|---|
| 0 | 0 | 0 | 0 | 0.000781944 | 0.000780332 | 0.00078125 |
| 0 | 0 | 0 | 1 | 0.001563887 | 0.001560665 | 0.0015625 |
| 0 | 0 | 1 | 0 | 0.002345831 | 0.002340997 | 0.00234375 |
| 0 | 0 | 1 | 1 | 0.003127774 | 0.00312133 | 0.003125 |
| 0 | 1 | 0 | 0 | 0.003909718 | 0.003901662 | 0.00390625 |
| 0 | 1 | 0 | 1 | 0.004691661 | 0.004681995 | 0.0046875 |
| 0 | 1 | 1 | 0 | 0.005473605 | 0.005462327 | 0.00546875 |
| 0 | 1 | 1 | 1 | 0.006255548 | 0.00624266 | 0.00625 |
| 1 | 0 | 0 | 0 | 0.007037492 | 0.007022992 | 0.00703125 |
| 1 | 0 | 0 | 1 | 0.007819435 | 0.007803325 | 0.0078125 |
| 1 | 0 | 1 | 0 | 0.008601379 | 0.008583657 | 0.00859375 |
| 1 | 0 | 1 | 1 | 0.009383323 | 0.00936399 | 0.009375 |
| 1 | 1 | 0 | 0 | 0.010165266 | 0.010144322 | 0.01015625 |
| 1 | 1 | 0 | 1 | 0.01094721 | 0.010924655 | 0.0109375 |
| 1 | 1 | 1 | 0 | 0.011729153 | 0.011704987 | 0.01171875 |
| 1 | 1 | 1 | 1 | 0.012492675 | 0.012510847 | 0.0125 |

MEASURE THE 4LSB VOLTAGE VOUT_IA_ISB

| dac<3> | dac<2> | dac<1> | dac<0> | Vout_sd | Vout_sd_ideal |
|---|---|---|---|---|---|
| 0 | 0 | 0 | 0 | 4.88E-05 | 4.88E-05 |
| 0 | 0 | 0 | 1 | 9.76E-05 | 9.77E-05 |
| 0 | 0 | 1 | 0 | 0.000146463 | 0.000146484 |
| 0 | 0 | 1 | 1 | 0.000195285 | 0.000195313 |
| 0 | 1 | 0 | 0 | 0.000244106 | 0.000244141 |
| 0 | 1 | 0 | 1 | 0.000292927 | 0.000292969 |
| 0 | 1 | 1 | 0 | 0.000341748 | 0.000341797 |
| 0 | 1 | 1 | 1 | 0.000390569 | 0.000390625 |
| 1 | 0 | 0 | 0 | 0.00043939 | 0.000439453 |
| 1 | 0 | 0 | 1 | 0.000488211 | 0.000488281 |
| 1 | 0 | 1 | 0 | 0.000537032 | 0.000537109 |
| 1 | 0 | 1 | 1 | 0.000585854 | 0.000585938 |
| 1 | 1 | 0 | 0 | 0.000634675 | 0.000634766 |
| 1 | 1 | 0 | 1 | 0.000683496 | 0.000683594 |
| 1 | 1 | 1 | 0 | 0.000732317 | 0.000732422 |
| 1 | 1 | 1 | 1 | 0.000781138 | 0.00078125 |

CALCULATE THE 16-BIT DAC VOUT BASED ON 8-BIT MSB, 4-BIT ISB AND 4-BIT LSB (2512)

2512-1 — CALCULATE THE 8-BIT MSB DAC OUTPUT VOLTAGE

3001:

$$\text{VoutH\_mismatch}_{i,0} := \sum_{j=0}^{msb-1} (b_{i,j}, \text{VH\_MSBdac}_j) + \text{VH\_MSB}$$

$$\text{VoutL\_mismatch}_{i,0} := \sum_{j=0}^{msb-1} (b_{i,j}, \text{VL\_MSBdac}_j) + \text{VL\_MSBd}$$

$$\text{VoutH\_mismatch}_{i,1} := \sum_{j=0}^{msb-1} (b_{i,j}, \text{VH\_MSBdac}_j) + \text{VH\_MS}$$

$$\text{VoutL\_mismatch}_{i,1} := \sum_{j=0}^{msb-1} (b_{i,j}, \text{VL\_MSBdac}_j) + \text{VL\_MSB}$$

CALCULATE THE 8-BIT MSB DAC + 4-BIT ISB OUTPUT VOLTAGE — 2512-2

3002:

$$\text{Vout\_mismatch}_{i,0} := \text{VoutL}_{i,0} + \frac{\text{Vout\_interpolation\_chop0}_{\text{LSB}(i)} - \text{VoutL}_{0,0}}{\text{VoutH}_{0,0} - \text{VoutL}_{0,0}} \cdot (\text{VoutH}_{i,0} - \text{VoutL}_{i,0})$$

$$\text{Vout\_mismatch}_{i,1} := \text{VoutH}_{i,1} + \frac{\text{Vout\_interpolation\_chop0}_{\text{LSB}(i)} - \text{VoutL}_{0,0}}{\text{VoutH}_{0,0} - \text{VoutL}_{0,0}} \cdot (\text{VoutL}_{i,1} - \text{VoutH}_{i,1})$$

$$\text{Vout}_i := \frac{(\text{Vout\_mismatch}_{i,0} + \text{Vout\_mismatch}_{i,1})}{2}$$

CALCULATE THE 8-BIT MSB + 4-BIT ISB + 4-BIT LSB OUTPUT VOLTAGE — 2512-3

3003:

$$\text{isd} := 0,1 .. 2^{nsd} - 1 \quad \text{MSB\_sd(isd)} := \text{floor}\left(\frac{\text{isd}}{2^{lsb+lsb\_sd}}\right)$$

$$\text{LSB\_coarse(isd)} := \text{floor}\left(\frac{\text{isd} - \text{MSB\_sd(isd)} \cdot 2^{lsb+lsb\_sd}}{2^{lsb\_sd}}\right)$$

$$\text{LSB\_fine\_12bits(isd)} := \text{floor}\left(\frac{\text{isd}}{2^{lsb\_sd}}\right)$$

$$\text{LSB\_fine(isd)} := \text{isd} - \text{MSB\_sd(isd)} \cdot 2^{lsb+lsb\_sd} - \text{LSB\_coarse(isd)} \cdot 2^{lsb\_sd}$$

$$\text{Vout\_sd}_{isd} := \text{Vout}_{\text{LSB\_fine\_12bits(isd)}} + \frac{\text{Vout\_mismatch\_sd}_{\text{LSB\_fine(isd)}} - \text{Vout}_0}{\text{Vout}_1 - \text{Vout}_0} \cdot$$
$$(\text{Vout}_{\text{LSB\_fine\_12bits(isd)}+1} - \text{Vout}_{\text{LSB\_fine\_12bits(isd)}})$$

2514

CALCULATE THE 16-BIT DAC DNL AND INL PERFORMANCE
THE CALCULATE 16-BIT DAC OUTPUT VOLTAGE IS VOUT_SD_MISMATCH

3102

$dnl := 1 .. 2^{nsd} - 1$ $$DNL\_sd\_mismatch_{dnl} := \frac{(Vout\_sd\_mismatch_{dnl} - Vout\_sd\_mismatch_{dnl-1})}{Res\_lsb\_ideal\_16} - 1$$

$$INL\_sd\_mismatch_{codesd} := \frac{(Vout\_sd\_mismatch_{codesd} - Vout\_sd\_ideal_{codesd})}{Res\_lsb\_ideal\_16}$$

CALCULATE THE 8-BIT MSB CALIBRATION CODE:
**CODE_8_BITS_MSB = (VH-VL_IDEAL) / (0.25 * LSB) FOR ISB = VREF/2$^{16}$**

3402

$$\text{Code\_MSBH}_{imsb} := \text{floor}\left[\frac{(\text{VH\_MSBdac}_{imsb} - \text{VH\_MSBdac\_ideal}_{imsb})}{\frac{\text{lsb\_calibration}}{\text{Calibration\_step}}}\right]$$

$$\text{Code\_MSBL}_{imsb} := \text{floor}\left[\frac{(\text{VL\_MSBdac}_{imsb} - \text{VL\_MSBdac\_ideal}_{imsb})}{\frac{\text{lsb\_calibration}}{\text{Calibration\_step}}}\right]$$

$$\text{Code\_MSBdacB\_H} := \text{floor}\left[\frac{(\text{VH\_MSBdacB} - \text{VH\_MSBdacB\_ideal})}{\frac{\text{lsb\_calibration}}{\text{Calibration\_step}}}\right]$$

$$\text{Code\_MSBdacB\_L} := \text{floor}\left[\frac{(\text{VL\_MSBdacB} - \text{VL\_MSBdacB\_ideal})}{\frac{\text{lsb\_calibration}}{\text{Calibration\_step}}}\right]$$

$\text{VH\_MSBdac\_cal}_{imsb} := \text{VH\_MSBdac}_{imsb} - \text{Code\_MSBH}_{imsb} \cdot \text{lsb\_calibration} \cdot \text{Calibration\_step}$ $\text{VL\_MSBdac\_cal}_{imsb} := \text{VL\_MSBdac}_{imsb} - \text{Code\_MSBL}_{imsb} \cdot \text{lsb\_calibration} \cdot \text{Calibration\_step}$ $\text{VL\_MSBdacB\_cal} := \text{VH\_MSBdacB} - \text{Code\_MSBdacB\_H} \cdot \text{lsb\_calibration} \cdot \text{Calibration\_step}$ $\text{VL\_MSBdacB\_cal} := \text{VL\_MSBdacB} - \text{Code\_MSBdacB\_L} \cdot \text{lsb\_calibration} \cdot \text{Calibration\_step}$

3402

| dac<15> | dac<14> | dac<13> | dac<12> | dac<11> | dac<10> | dac<9> | dac<8> | VH | VL | VH_VL_ideal | VH_cal | VL_cal |
|---|---|---|---|---|---|---|---|---|---|---|---|---|
| 0 | 0 | 0 | 0 | 0 | 0 | 0 | 0 | 0.012511097 | 0.01248532 | 0.0125 | 0 | -2 |
| 0 | 0 | 0 | 0 | 0 | 0 | 0 | 1 | 0.012510847 | 0.012492675 | 0.0125 | 0 | -1 |
| 0 | 0 | 0 | 0 | 0 | 0 | 1 | 0 | 0.025023242 | 0.02498 | 0.025 | 1 | -2 |
| 0 | 0 | 0 | 0 | 0 | 1 | 0 | 0 | 0.050023097 | 0.049984413 | 0.05 | 1 | -2 |
| 0 | 0 | 0 | 0 | 1 | 0 | 0 | 0 | 0.100018671 | 0.099992746 | 0.1 | 1 | -1 |
| 0 | 0 | 0 | 1 | 0 | 0 | 0 | 0 | 0.200012006 | 0.199871434 | 0.2 | 0 | -11 |
| 0 | 0 | 1 | 0 | 0 | 0 | 0 | 0 | 0.400110296 | 0.399779774 | 0.4 | 9 | -19 |
| 0 | 1 | 0 | 0 | 0 | 0 | 0 | 0 | 0.799535414 | 0.800237608 | 0.8 | -39 | 19 |
| 1 | 0 | 0 | 0 | 0 | 0 | 0 | 0 | 1.600260229 | 1.600174707 | 1.6 | 21 | 14 |

FIG. 35

CALCULATE THE 4-BIT ISB CALIBRATION CODE
**CODE_8_BITS_ISB = (VOUT_IA_ISB-VOUT_IA_ISB_IDEAL) / (0.25 * LSB)**

$$\text{Code\_LSB0}_{\text{lsbcode}} := \text{floor} \left[ \frac{(\text{Vout\_LSB0}_{\text{lsbcode}} - \text{Vout\_LSB0\_ideal}_{\text{lsbcode}})}{\text{lsb\_calibration} \cdot \text{Calibration\_step}} \right]$$

$$\text{Code\_LSB1}_{\text{lsbcode}} := \text{floor} \left[ \frac{(\text{Vout\_LSB1}_{\text{lsbcode}} - \text{Vout\_LSB1\_ideal}_{\text{lsbcode}})}{\text{lsb\_calibration} \cdot \text{Calibration\_step}} \right]$$

$$\text{Vout\_LSB0\_cal}_{\text{lsbcode}} := \text{Vout\_LSB0}_{\text{lsbcode}} - \text{Code\_LSB0}_{\text{lsbcode}} \cdot \text{lsb\_calibration} \cdot \text{Calibration\_step}$$

$$\text{Vout\_LSB1\_cal}_{\text{lsbcode}} := \text{Vout\_LSB1}_{\text{lsbcode}} - \text{Code\_LSB1}_{\text{lsbcode}} \cdot \text{lsb\_calibration} \cdot \text{Calibration\_step}$$

| dac<7> | dac<6> | dac<5> | dac<4> | Vout chop0 | Vout chop1 | Vout_ideal | Vout_chop0_cal | Vout_chop1_cal |
|---|---|---|---|---|---|---|---|---|
| 0 | 0 | 0 | 0 | 0.000781944 | 0.000780332 | 0.00078125 | 0 | -1 |
| 0 | 0 | 0 | 1 | 0.001563887 | 0.001560665 | 0.0015625 | 0 | -1 |
| 0 | 0 | 1 | 0 | 0.002345831 | 0.002340997 | 0.00234375 | 0 | -1 |
| 0 | 0 | 1 | 1 | 0.003127774 | 0.00312133 | 0.003125 | 0 | -1 |
| 0 | 1 | 0 | 0 | 0.003909718 | 0.003901662 | 0.00390625 | 0 | -1 |
| 0 | 1 | 0 | 1 | 0.004691661 | 0.004681995 | 0.0046875 | 0 | -1 |
| 0 | 1 | 1 | 0 | 0.005473605 | 0.005462327 | 0.00546875 | 0 | -1 |
| 0 | 1 | 1 | 1 | 0.006255548 | 0.00624266 | 0.00625 | 0 | -1 |
| 1 | 0 | 0 | 0 | 0.007037492 | 0.007022992 | 0.00703125 | 0 | -1 |
| 1 | 0 | 0 | 1 | 0.007819435 | 0.007803325 | 0.0078125 | 0 | -1 |
| 1 | 0 | 1 | 0 | 0.008601379 | 0.008583657 | 0.00859375 | 0 | -1 |
| 1 | 0 | 1 | 1 | 0.009383323 | 0.00936399 | 0.009375 | 0 | -1 |
| 1 | 1 | 0 | 0 | 0.010165266 | 0.010144322 | 0.01015625 | 0 | -1 |
| 1 | 1 | 0 | 1 | 0.01094721 | 0.010924655 | 0.0109375 | 0 | -2 |
| 1 | 1 | 1 | 0 | 0.011729153 | 0.011704987 | 0.01171875 | 0 | -2 |
| 1 | 1 | 1 | 1 | 0.012492675 | 0.012510847 | 0.0125 | -1 | 0 |

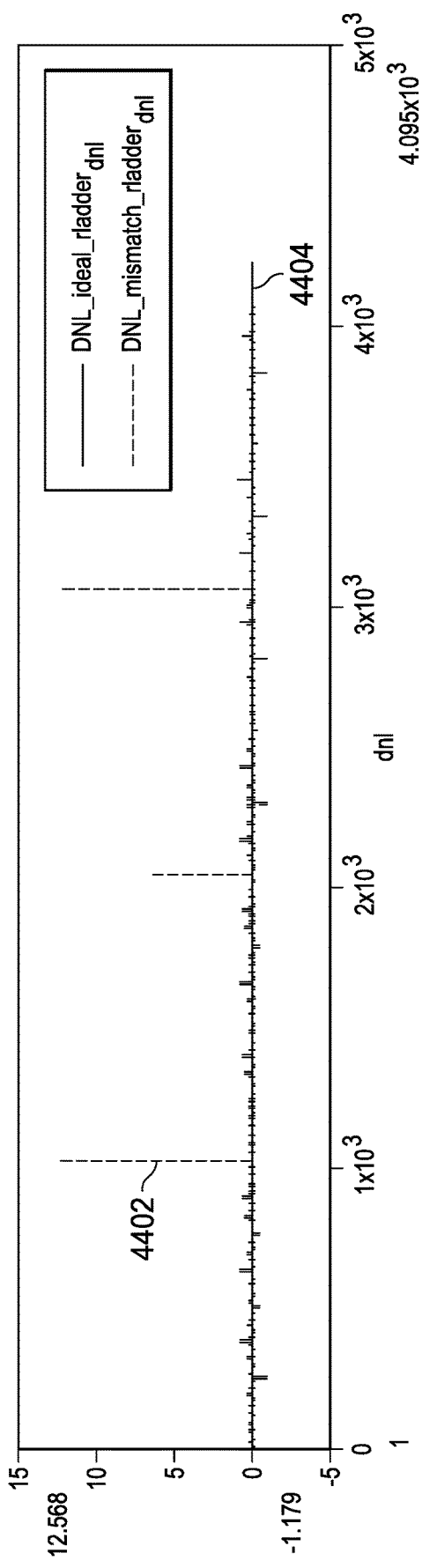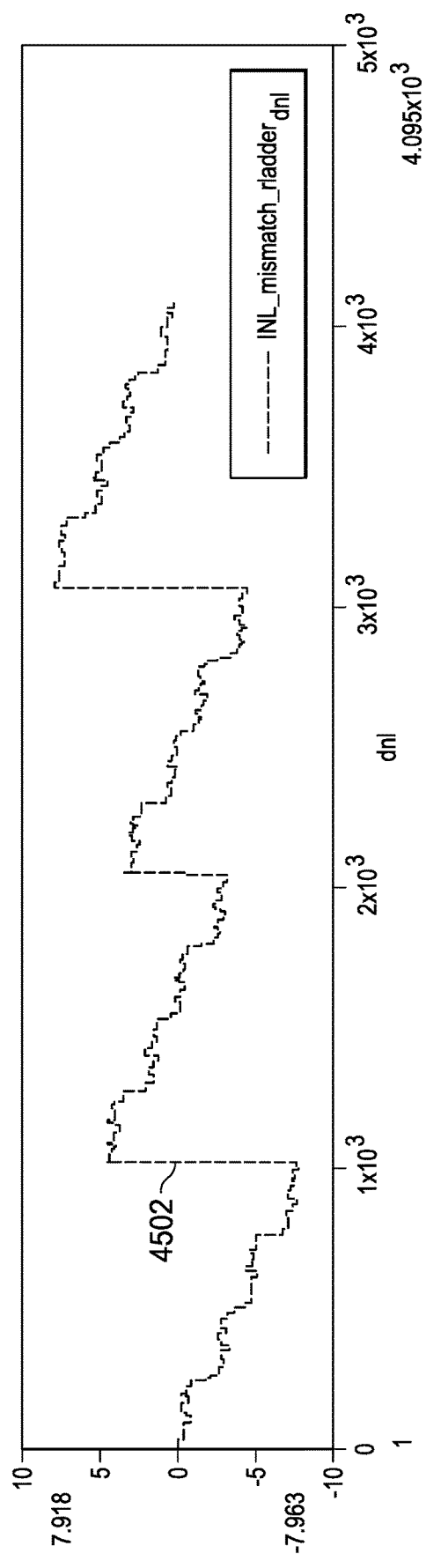

SEGMENTED DIGITAL-TO-ANALOG CONVERTER

CROSS REFERENCE TO RELATED APPLICATIONS

This application is a continuation of U.S. patent application Ser. No. 16/023,816, filed Jun. 29, 2018, which is a continuation of U.S. patent application Ser. No. 15/790,986, filed Oct. 23, 2017, which is a continuation of PCT/CN2017/089299, filed Jun. 21, 2017, all are incorporated herein by reference in their entirety.

BACKGROUND

The present application is related to digital-to-analog converter circuits (DACs). DAC circuits are often employed in conjunction with (or integrated into) microcontrollers or microprocessor circuits to convert digital values to analog signals for a variety of applications. High DAC accuracy is desirable in many applications, such as medical devices, optical devices industrial control products, display drivers, etc. Higher accuracy DACs typically occupy significant circuit area, and increased bit accuracy generally results in significant increases in the number of switches and resistor elements. In addition, more calibration memory and calibration time are required for DAC circuits that provide high bit accuracy.

SUMMARY

Disclosed examples provide segmented DAC circuits which can be used in any suitable application, including without limitation successive approximation register analog-to-digital converters (SAR ADCs) or any other type of a DC. The segmented DAC circuits include a resistor DAC to convert a first subword including a most significant bit (MSB) to a first analog output signal, as well as an interpolation DAC to offset the first analog output signal, and a modulator circuit, such as a Sigma Delta modulator (SDM) to modulate a modulator code to provide a digital interpolation code signal that represents a value of second and third subwords. The interpolation code signal is provided to the interpolation DAC to offset the first analog output signal. In certain examples, the resistor DAC is a resistor-two-resistor (R-2R) DAC circuit with fewer switches and resistor elements than traditional resistor DACs to convert the first subword. Further disclosed segmented DAC circuits include a resistor DAC to convert a first subword to a first analog output signal, a resistive ordered element matching (OEM) circuit, a resistive chopper circuit, and an interpolation DAC to offset the first analog output signal based on a second subword to provide an analog output signal. Further disclosed examples include a DAC calibration method to calibrate a DAC circuit to convert a K-bit digital input signal, where the digital input signal includes an M-bit first subword including a most significant bit, an I-bit second subword, and an L-bit third subword including a least significant bit, where K=M+I+L. The method includes measuring an integer number M+1 output voltages of an M-bit resistor DAC for a corresponding set of M+1 values of a first subword, measuring $2^I$ output voltages of an I-bit interpolation DAC for a corresponding set of $2^I$ unique values of a second subword, and measuring $2^L$ output voltages of an L-bit SDM for a corresponding set of $2^L$ unique values of a third subword. The method further includes calculating a K-bit output voltage value based on the measured output voltages, calculating calibration codes for the resistor DAC, the interpolation DAC, and the SDM, calculating a K-bit calibration code for the DAC circuit based on the calibration codes for the resistor DAC, the interpolation DAC, and the SDM, and storing the K-bit calibration code in a memory.

BRIEF DESCRIPTION OF THE DRAWINGS

FIG. 25 is a flow diagram of an example calibration method or process for calibrating the segmented DAC.

FIG. 26 is a flow diagram of another calibration method.

FIGS. 27-29 are partial schematic diagrams showing example MSB, ISB and LSB measurements in the calibration method of FIG. 25.

FIG. 30 is a partial schematic diagram showing example calculation of a DAC output voltage in the calibration method of FIG. 25.

FIG. 34 is a partial schematic diagram showing example calculation of recorded calibration DAC codes in the calibration method of FIG. 25.

FIG. 35 is a partial schematic diagram showing further example calculation of recorded calibration DAC codes in the calibration method of FIG. 25.

FIG. 44 is a graph showing example resistor DAC DNL for an ideal resistor ladder and a mismatched resistor ladder with a resistor DAC chop function in the segmented DAC.

FIG. 45 is a graph showing example resistor DAC INL for an ideal resistor ladder and a mismatched resistor ladder with a resistor DAC chop function in the segmented DAC.

DETAILED DESCRIPTION

Figure 1:
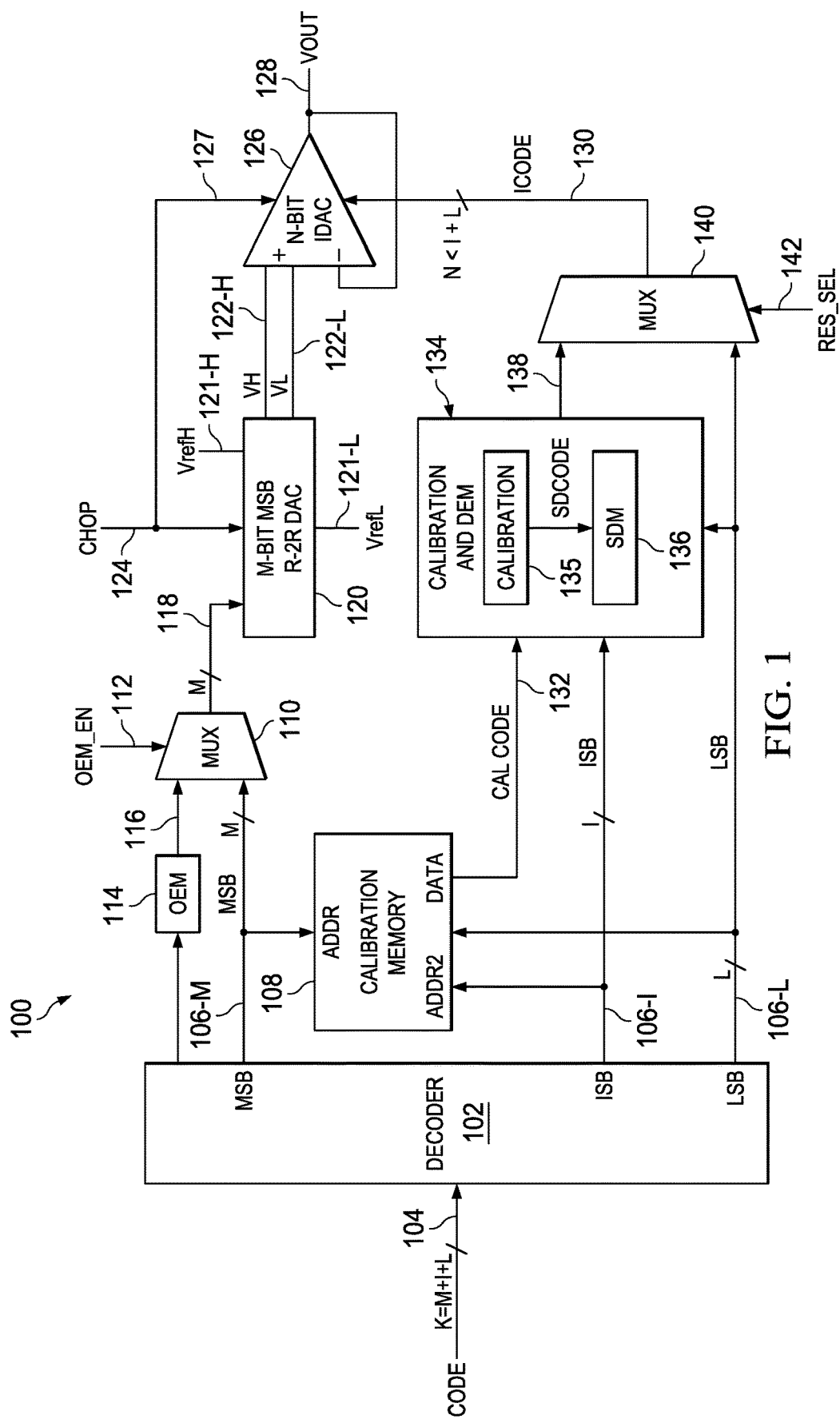
FIG. 1 is a schematic diagram of a segmented digital-to-analog converter (DAC) with a resistor-to-resistor (R-2R) most significant bit (MSB) DAC.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an example segmented DAC circuit 100, including an input decoder 102 with an input 104 that receives a K-bit binary-coded digital input signal (CODE) for conversion to provide an analog output signal VOUT that represents the value of the digital input signal CODE. The digital input signal CODE includes an M-bit first subword (MSB), an I-bit second subword (ISB) and an L-bit third subword, where M, I and L are each greater than 1, and K=M+I+L. The first subword is referred to herein as an "MSB subword" with M bits that includes a most significant bit of a digital input signal CODE. The third subword LSB includes the least significant bit of the digital input signal CODE. The decoder 102 includes an output 106-M providing the M-bit first word MSB to an address (ADDR) input of a calibration memory 108. The decoder 102 also includes an output 106-I that provides the I-bit second subword ISB, and a further output 106-L the provides the L-bit third subword LSB. The decoder 102 in this example buffers and parses the digital input signal CODE into the MSB, ISB and LSB subwords without modification. In other examples, the decoder 102 can perform other digital signal operations on the digital input signal CODE. In other implementations, the decoder 102 can be omitted. The digital input signal CODE can be received from any suitable digital signal source, such as a microcontroller (not shown).

The calibration memory 108 stores calibration data indexed according to the first subword MSB received at the first address input ADDR, or according to the second subword ISB received at anther address input ADDR2 from the decoder output 106-I. In one example, the memory 108 stores a first set of K×M bits of calibration data for calibration of the first subword MSB, a second set of K×M bits of calibration data for calibration of the second subword ISB, and a third set of K×M bits of calibration data for calibration of the third subword LSB In certain examples, the calibration memory 108 provides a calibration code CAL CODE from the calibration data based on the digital input signal CODE. The DAC circuit 100 also includes a multiplexer 110 with an enable input 112 to receive a select or enable signal OEM EN. The multiplexer 110 includes a first input 116 that receives an M-bit OEM signal from an OEM memory 114, and a second input that receives the M-bit first subword MSB. An output 118 of the multiplexer 110 provides an M-bit input signal to an M-bit MSB resistor DAC 120.

In one example, the resistor DAC 120 is a resistor-two-resistor (R-2R) DAC including a resistor circuit and a switching circuit that operates according to the M-bit input from the multiplexer output 118. In other examples, the resistor DAC 120 can be a resistive ladder circuit (e.g., FIG. 8 below) to provide a voltage divider with a switching circuit operated according to the multiplexer output. In other implementations, the resistor DAC 120 is a resistive matrix DAC circuit (e.g., FIG. 7 below), including a matrix of resistor elements and switches formed in rows and columns to provide a voltage divider operated according to the M-bit input from the multiplexer output 118. The resistor DAC 120 operates according to a reference voltage to provide a voltage divider output is a first analog output signal. In the illustrated example, the resistor DAC 120 includes first and second inputs 121-H and 121-L to receive reference voltages VrefH and VrefL. A voltage divider circuit is formed by resistors in the resistor DAC 120 to provide the first analog output signal at a first converter output 122 at or between the levels of the reference voltages VrefH and VrefL according to the M-bit input from the multiplexer output 118. In operation when the multiplexer 110 delivers the first subword at the output 118, the first analog output signal represents the value of the first subword MSB. In the example of FIG. 1, the resistor DAC 120 provides a differential first analog output signal VH, VL at first and second outputs 122-H and 122-L. In other possible implementations, the resistor DAC 120 provides a single-ended first analog output signal. In certain examples, the resistor DAC 120 includes a resistive chopper circuit operating according to a single or multi-bit chopper switching control signal "chop" received at an input 124.

The DAC circuit 100 also includes an interpolation DAC 126 with an output 128 that provides the analog output signal VOUT. The interpolation DAC 126 includes an input 130 that receives an N-bit digital interpolation code signal ICODE, where N is an integer greater than 1. The interpolation DAC 126 offsets the first analog output signal VH, VL based on the interpolation code signal ICODE to provide the analog output signal VOUT. In one example, the interpolation DAC 126 increases or decreases the first analog output signal by an amount determined by the interpolation code signal ICODE. In certain implementations, the interpolation DAC 126 includes a chopping circuit operated according to a chopper signal "chop" received at an input 127. In the illustrated example, the interpolation DAC 126 operates as an offsetting amplifier, with a differential non-inverting input (+) connected to the outputs 122-H, 122-L of the resistor DAC 120, and an inverting input (−) connected to the output 128 to provide feedback of the analog output signal VOUT.

The DAC circuit 100 also includes a calibration and dynamic element matching (DEM) circuit 134 with a calibration circuit 135. The circuit 134 includes an input 132 that receives a calibration code (CALCODE) from a data output (DATA) of the calibration memory 108. The calibration and DEM circuit 134 in certain examples also receives the second subword ISB from the decoder output 106-I and the third subword LSB from the decoder output 106-L. The circuit 134 in certain examples also includes a Sigma Delta modulator 136 (SDM). The SDM 136 in one example is a first-order modulator. In other examples, second order or higher order modulators can be used. The calibration circuit 135 provides the modulator code SDCODE to the SDM 136 based on the calibration code CAL CODE and the second and third subwords ISB, LSB. In one implementation, the SDM 136 modulates the modulator code SDCODE from the calibration circuit 135 to provide the N-bit digital interpolation code signal ICODE that represents a value of the second and third subwords ISB, LSB, where N is less than I+L. In another example, the SDM 136 modulates and N-bit interpolation code signal based on the first and second subwords ISP, LSB. The SDM 136 in certain examples provides the N-bit digital interpolation code signal ICODE at an output 138 of the circuit 134. The SDM output represents the value of second and third subwords ISB, LSB. The multiplexer 140 includes a control input 142 that receives a single-bit resolution select signal RES_SEL. In one state of the RES_SEL signal, the multiplexer 140 provides the N-bit interpolation code signal ICODE from the output 138 of the circuit 134 at the input 130 of the interpolation DAC 126 for (M+I+L)-bit resolution of the DAC circuit 100. In another state of the RES_SEL signal, the multiplexer 140 provides the LSB subword signal from the decoder output 106-L to the interpolation DAC input 130. The interpolation DAC 130 offsets the first analog output signal VH, VL according to the interpolation code ICODE provided by the multiplexer 140 to generate the output voltage signal VOUT.

Figure 2:
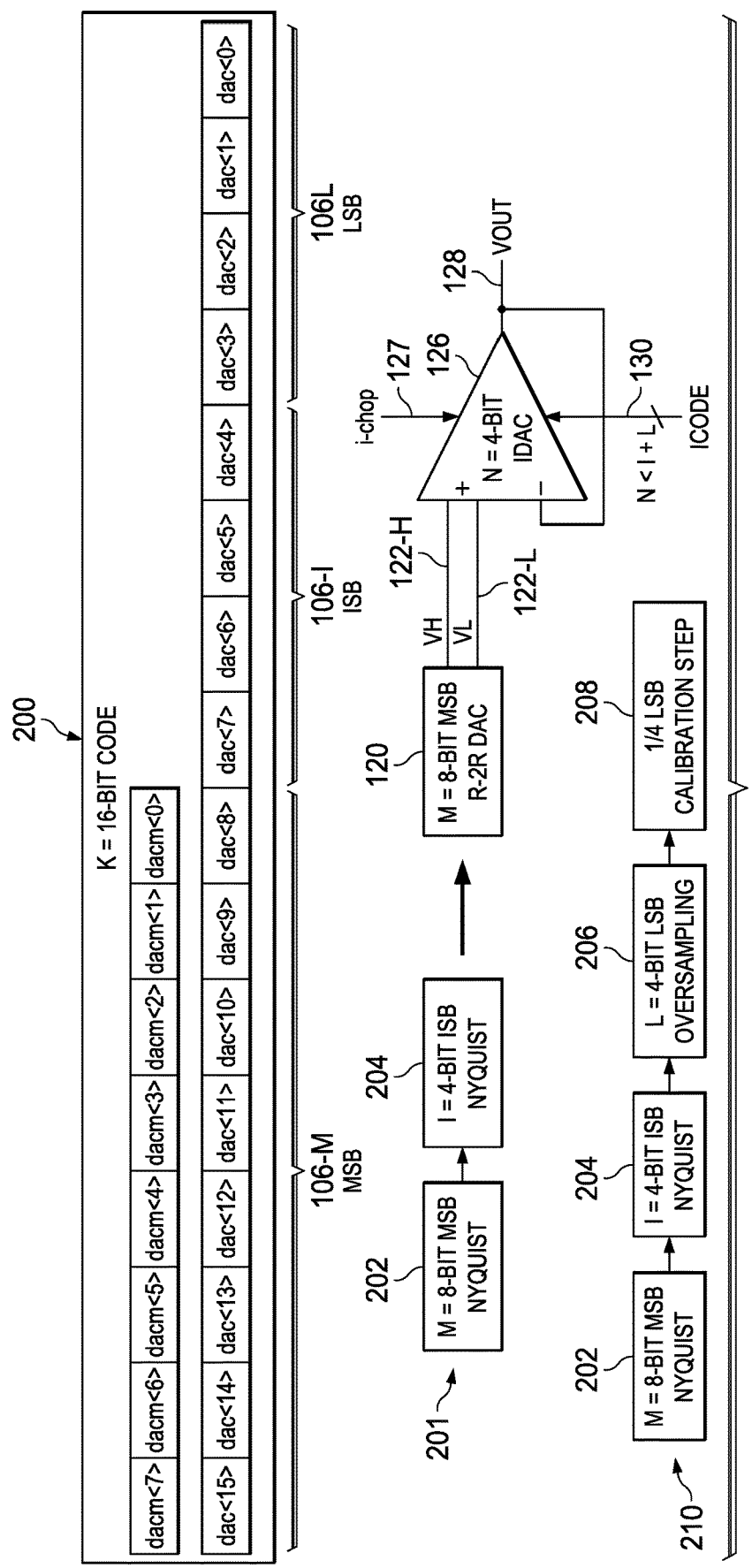
FIG. 2 is a schematic diagram illustrating example operation of one implementation or configuration of the segmented DAC.
Figure 3:
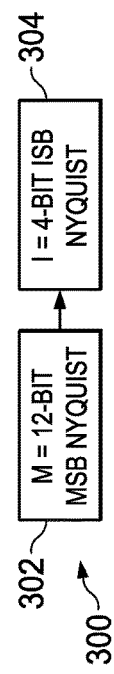
FIG. 3 is a schematic diagram illustrating an example operation of another implementation or configuration of the segmented DAC.

Referring also to FIGS. 2 and 3, FIG. 2 illustrates an example 16-bit (K=16) example digital input signal 200 (CODE). The 16-bit example digital input signal 200 includes a 8-bit first subword MSB (provided at the decoder output 106-M in FIG. 1) where M=4, as well as a 4-bit intermediate second subword ISB (I=4), and a 4-bit third subword LSB (L=4). The most significant subword MSB includes bits dac<15:8> (dacm<7:0>), the second subword ISB includes bits dac<7:4>, and the third subword LSB includes bits dac<3:0>. A conversion flow 201 is shown in FIG. 2 for this example, including Nyquist sampled conversion of the M=8-bit first subword at 202 and a further conversion at 204 in which the I=4-bit intermediate second subword ISB undergoes Nyquist sampled conversion. The conversion 201 is equivalent to operation of the resistor DAC 120 and the interpolation DAC 126 as schematically illustrated in FIG. 2. FIG. 2 also shows example operation of one implementation or configuration of the segmented DAC circuit 100 at 210. In this example, the 8-bit and 4-bit Nyquist conversion of the first and second subwords at 202 and 204 is supplemented by L=4-bit oversampling conversion of the third subword LSB at 206. In certain examples, the conversion is augmented by a ¼ LSB calibration step shown at 208 in FIG. 2. FIG. 3 shows an operational flow 300 of another implementation or configuration of the segmented DAC. In this example, a 12-bit resistor DAC 120 is used (M=12) for Nyquist sampled conversion at 302, and an I=4-bit Nyquist sampled conversion of a second subword (ISB). Both the examples in FIGS. 2 and 3 provide 16-bit resolution for the segmented DAC circuit 100. These examples are non-limiting, and other implementations are possible using any suitable values for K, M, I and L.

Figure 4:
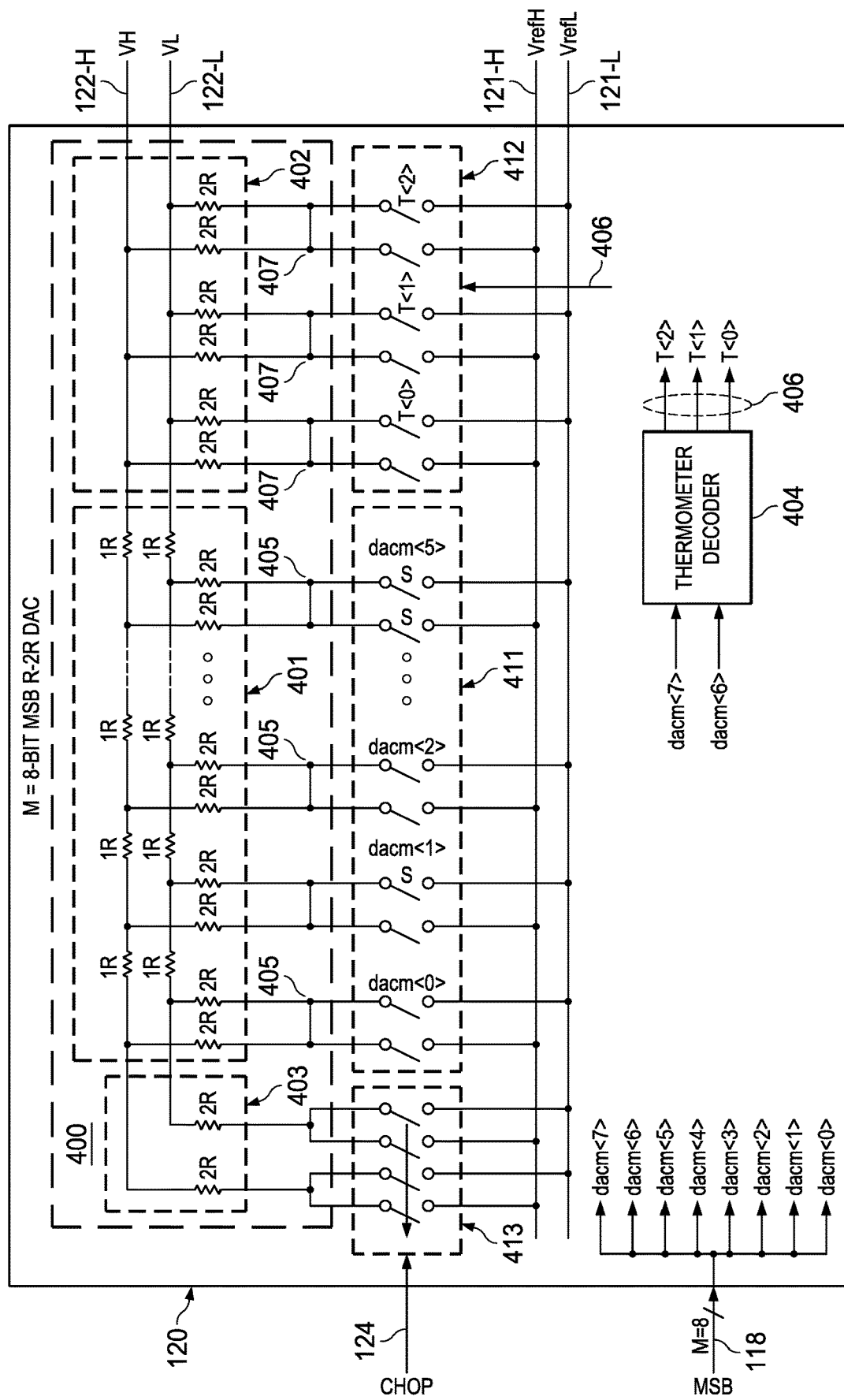
FIG. 4 is a schematic diagram of an example 8-bit R-2R MSB DAC in the segmented DAC with a chopper circuit.

FIG. 4 shows an example 8-bit R-2R MSB DAC in the segmented DAC circuit 100. This example also includes chopper circuits and dynamic element matching circuitry, although not required for all possible implementations. The resistor DAC 120 in this example is an R-2R DAC circuit with a resistor circuit 400 including an R-2R circuit 401 and a first switching circuit 411. The resistor DAC 120 is connected to provide the first analog output signal VH, VL to the differential first converter output 122-H and 122-L. The circuit 400 provides a resistive voltage divider with inputs 121-H and 121-L to receive the reference voltage signal VrefH, VrefL, as well as resistors formed into resistor elements of resistance values 1R, 2R.

The circuit is configured as a series of segments that individually include a tap node 405. The R-2R circuit 401 includes M or fewer segments, each having two R-2R portions individually associated with a corresponding one of the differential outputs 122. Each of the portions includes a resistor element with a resistance value of 1R connected in series with the 1R elements of the other segments, as well as a resistor element having a resistance 2R connected to the switching circuit at a corresponding tap node 405. The illustrated example is a differential R-2R circuit. Single-ended limitations are possible with a single output line 122, and each R-2R segment including a single 1R element and a single 2R element. The individual resistor elements (1R and/or 2R) can be single resistor components or can be multiple resistor components connected in any suitable series and/or parallel configuration to provide the corresponding 1R or 2R resistance. In the illustrated implementation, a single tap node 405 is connected to both 2R elements in each of the R-2R segments. The first switching circuit 411 includes a plurality of switches S individually connected between a corresponding one of the tap nodes 405 and the voltage divider input 121. In the illustrated differential example, the switching circuit 411 includes first and second switches for each R-2R segment, with each switch connected between the segment tap node 405 and a corresponding one of the inputs 121-H, 121-L. The switches of the circuit 411 are operated in complementary fashion according to a corresponding one of the first subword bits dacm<7:0> (dac,13:8) to connect the corresponding segment tap node 405 with the input 121-H (VrefH) or the input 121-L (VrefL).

In the example of FIG. 4, the resistor circuit 401 includes 6 segments switched according to the first 6 MSB bits dacm<5:0>, and the remaining 2 MSB bits dacm<7:6> are provided as inputs to a thermometer decoder 404. The decoder 404 includes an output 406 that provides thermometer coded switching control signals T<2:0> to operate an ordered element matching (OEM) switching circuit 412. Ordered element matching is implemented by a resistive OEM circuit 402 with three sets of OEM resistor elements. In one example, the resistor elements have resistances 2R. A 2R element of each set is connected between an OEM tap node 407 of the set and a corresponding one of the outputs 122-H, 122-L. An OEM switching circuit 412 includes three sets of two OEM switches to selectively connect a corresponding one of the OEM resistor elements between the voltage divider input 121 and the first converter output 122 based on a OEM code set by the switching control signals T<2:0> from the thermometer decoder 404. The OEM switches are operated in complementary fashion according to a corresponding one of the control signals T<2:0> to connect the corresponding OEM tap node 407 with the input 121-H (VrefH) or the input 121-L (VrefL).

The resistor DAC 120 in FIG. 4 also includes a resistive chopper circuit 403 with a plurality of chopper resistors of resistance value 2R, and a chopper switching circuit 413. The chopper switching circuit 413 includes an input 124 to receive the chopper code "chop", and chopper switches to selectively concurrently connect a corresponding one of the chopper resistors to the voltage divider inputs 121-H and 121-L. The chopper circuitry can be omitted in some embodiments, with the R-2R circuitry providing component segments for all the MSB bits dacm<M−1:0>.

The DAC circuit 100 of FIGS. 1 and 4 advantageously employs an R-2R MSB resistor DAC 120 to convert the first subword MSB to the first analog output signal VH, VL using significantly fewer switches than traditional resistor ladder MSB DACs. The circuit 100 also provides an interpolation DAC buffer stage 126 which minimizes the calibration memory requirement, and thus the storage capacity of the calibration memory 108 can be much smaller than traditional designs. The sigma delta modulator 136 can be selectively employed to achieve additional resolution of the DAC circuit 100, and no additional calibration DAC is required to achieve 16-bit resolution. The reduction in switches and memory capacity allows reduction in circuit area and power consumption. Also, fewer switches are used without decreasing the number bits M of the first subword to improve overall DAC performance. Certain implementations include the DEM circuitry 134 to improve the overall DAC INL/DNL performance.

The R-2R resistor DAC 120 in FIG. 4 operates according to the MSB bits dacm<5:0>. The switches of the circuit 411 are switched between V=0 (logic 0) and V=Vref (logic 1), where Vref-VrefH-VrefL in the illustrated differential example. The R-2R network causes the MSB digital bits to be weighted in their contribution to the output voltage VOUT. Depending on which bits are set to 1 and which to 0, the output voltage VOUT has a corresponding stepped value between 0 and Vref minus the value of the minimal step, corresponding to bit 0 (dacm<0>). The actual value of Vref (and the voltage of logic 0) will depend on the type of technology used to generate the digital signals. An R-2R DAC is a binary weighted voltage divider. The 2R leg in parallel with each 1R resistor in series creates a binary weighting, and only one bit of the first subword MSB is needed for each bit of resolution. The switch is either connected to ground or to the reference voltage. In addition, the equivalent impedance of the resistor ladder is typically lower than that of conventional string DACs, and therefore, the resistor DAC circuit 120 has lower noise.

Figure 5:
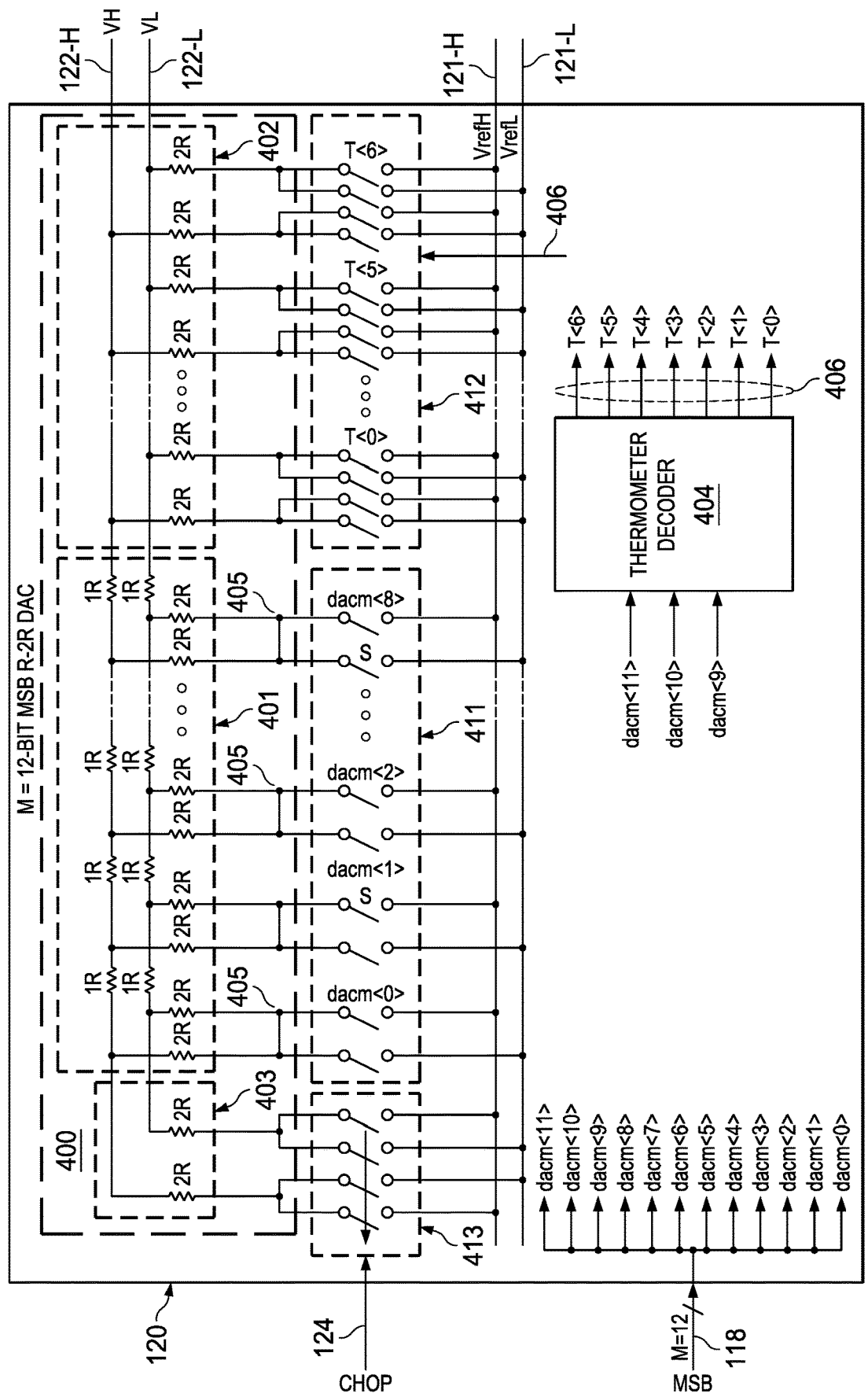
FIG. 5 is a schematic diagram of an example 12-bit R-2R MSB DAC in the segmented DAC with a chopper circuit.

FIG. 5 shows another resistor DAC circuit example where M=12. The circuit 120 in FIG. 5 also uses an R-2R MSB DAC in the segmented DAC with a chopper circuit. In this example, a 16-bit resolution is achieved without the SDM 136. The 12-bit resistor DAC 120 in this example includes 9 R-2R segments switched according to the first 9 MSB bits dacm<8:0>, and the remaining three MSB bits dacm<11:9> are provided as inputs to a thermometer decoder 404. The decoder output 406 in this example provides thermometer coded switching control signals T<6:0> to operate a seven segment OEM switching circuit 412. The segmented DAC circuit 100 using the resistor DACs 120 of FIGS. 4 and 5 also facilitates reduced calibration memory requirements and shortens factory calibration times. In certain examples, high performance for low INL and DNL can be achieved. For a 16-bit case, for example, INL and DNL of less than +/−1LSB can be achieved over a +/−32LSB calibration range with +/−¼ calibration step. Calibration memory in one 16-bit example using the 12-bit MSB DAC 120 requires only 12×8-bits of memory 108 for the MSB calibration with chopper functionality, 12×8-bits of memory for the MSB calibration without chopper functions and 16×6-bits of memory for the LSB calibration. No additional calibration DAC is used in this example.

Figure 6:
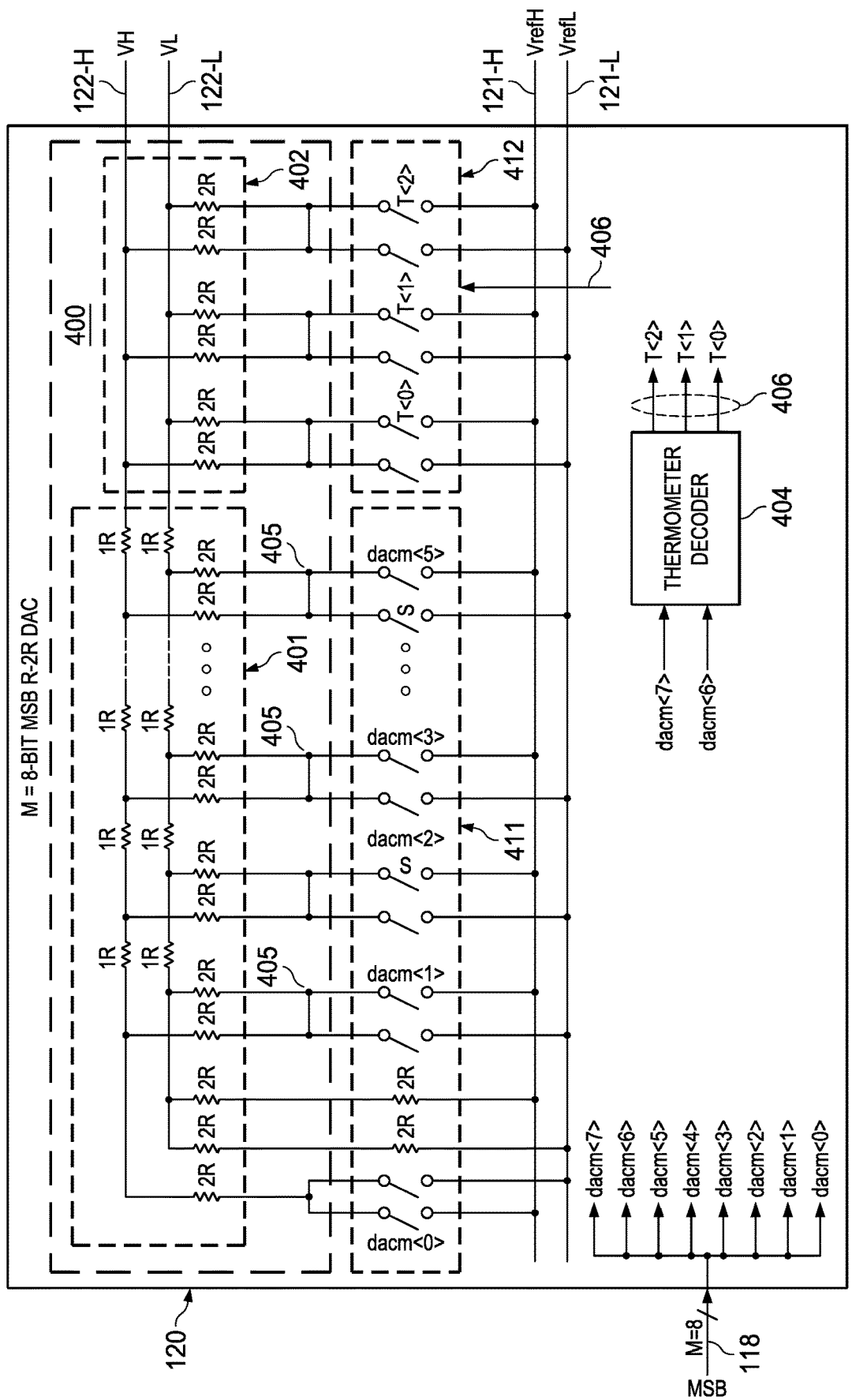
FIG. 6 is a schematic diagram of an example 8-bit R-2R MSB DAC in the segmented DAC without a chopper circuit.

FIG. 6 shows an example 8-bit R-2R MSB DAC in the segmented DAC without a chopper circuit. This example uses 6 R-2R segments controlled by dacm<5:0> and an OEM circuit 402, 412 operated according to control signals T<2:0> from a thermometer decoder 404 based on dacm<7:6>. This example provides lower power consumption compared to the examples of FIGS. 4 and 5.

Figure 7:
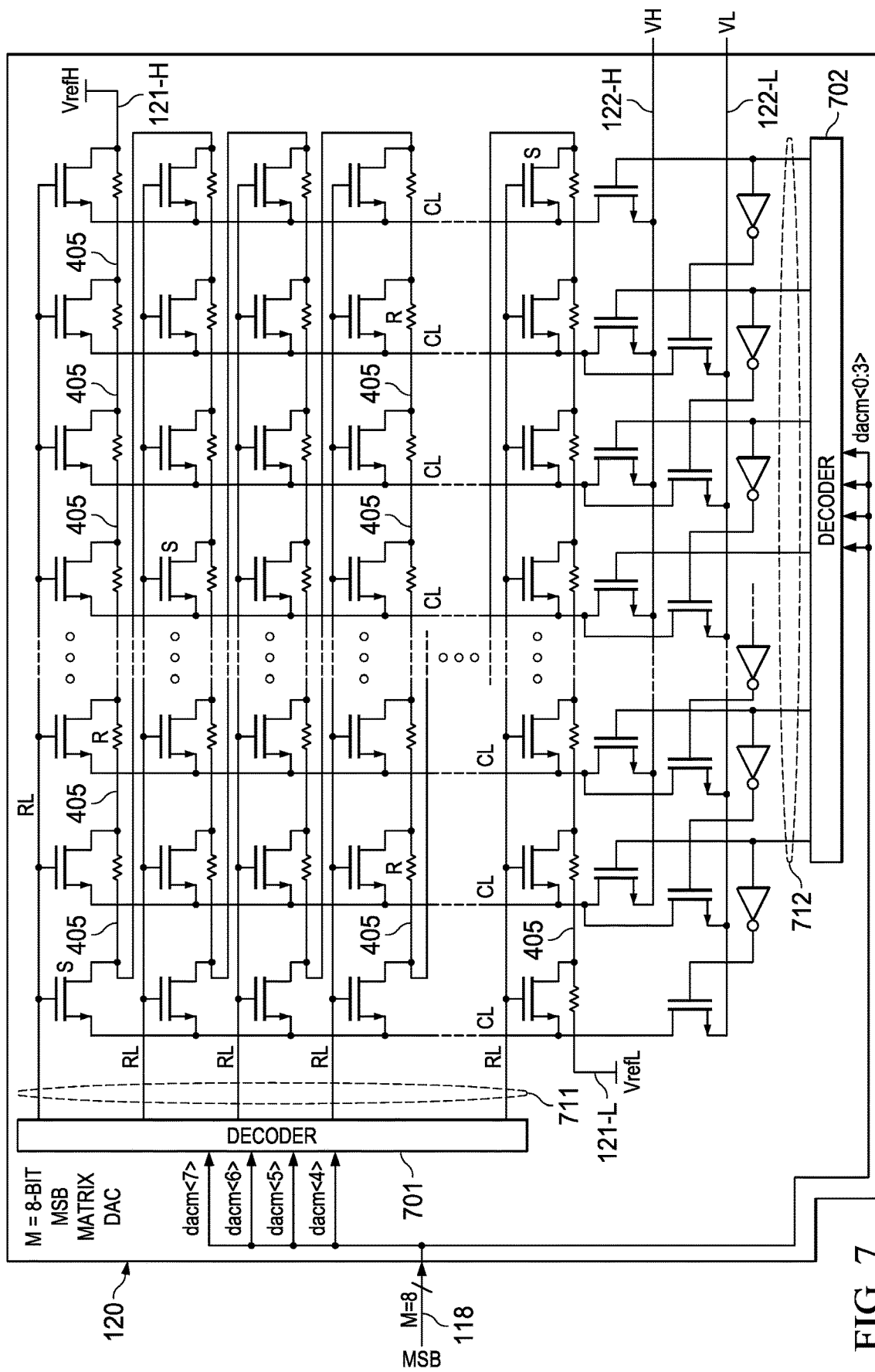
FIG. 7 is a schematic diagram of an example 8-bit matrix MSB DAC in the segmented DAC.

FIG. 7 shows an example 8-bit matrix MSB resistor DAC 120 which can be used in the segmented DAC 100. In this example, the resistor DAC 120 is a matrix DAC with resistors configured in a matrix of resistors with multiple rows and columns, chopper functionality and without OEM circuitry. The resistors R of a given row are connected in series with one another to define tap nodes 405, and the ends of the rows are connected to the beginning of the next row. The first end of the first row is connected to the input 121-H (VrefH) and the final end of the last row is connected to the input 121-L (VrefL). A first set of the switches S are configured in the matrix to selectively connect a corresponding tap node 405 with a corresponding column line CL of the matrix based on one of a first set of switching control signals 711 along a corresponding row line RL of the matrix. A row decoder 701 provides the row select signals according to the most significant set of bits dacm<7:4> of the first subword MSB. A second set of the switches S are configured to selectively connect a corresponding one of the row lines RL to one of the converter outputs 122-H or 122-L based on a corresponding one of a set of second switching control signals 712 from a second (column) decoder 702 based on the remaining lease significant first subword bits dacm<3:0>. Other matrix resistor DACs can be used, having any suitable number of rows and columns in different implementations.

Figure 8:
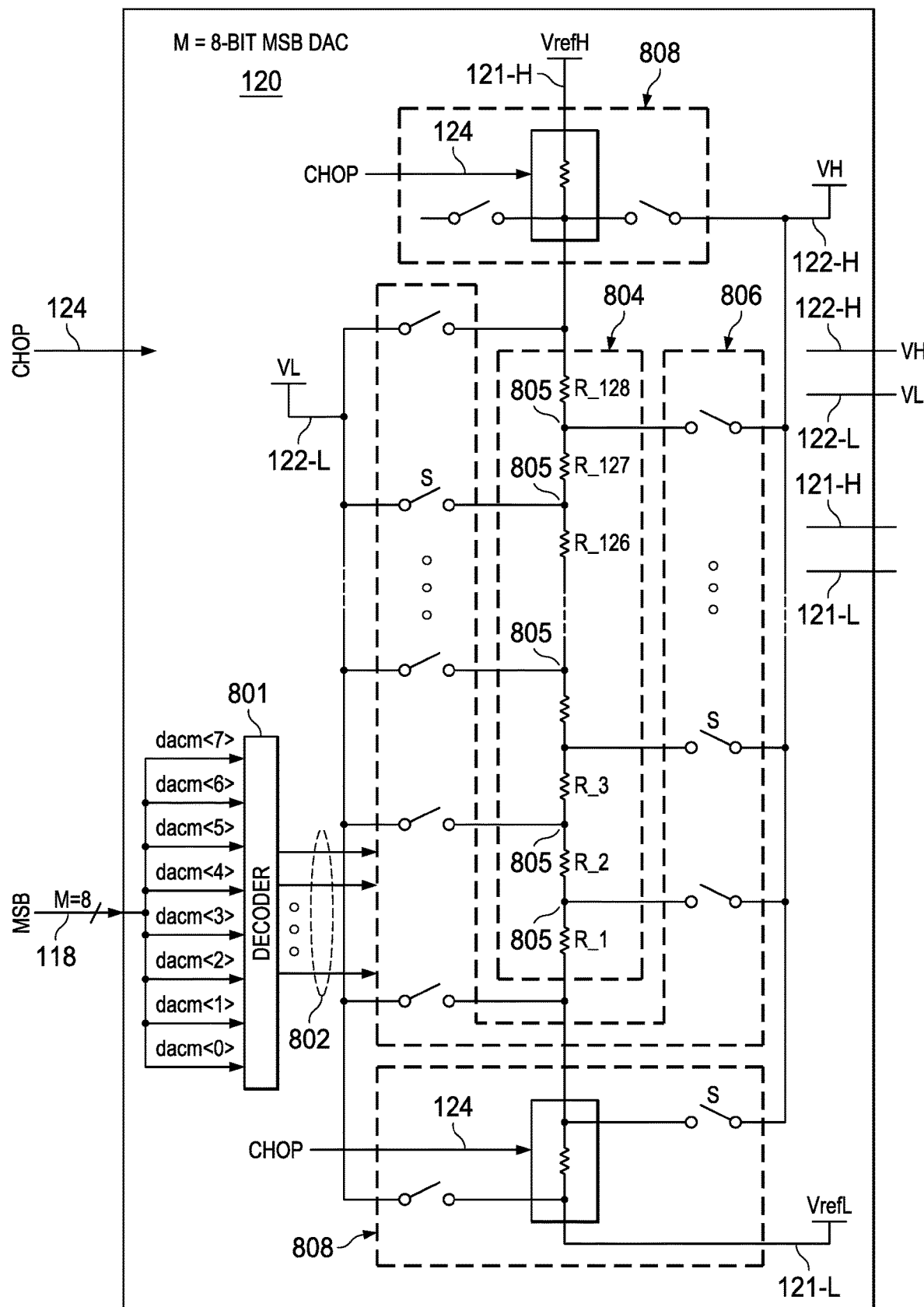
FIG. 8 is a schematic diagram of an example 8-bit binary-weighted MSB DAC in the segmented DAC.

FIG. 8 shows an example 8-bit binary-weighted MSB DAC in the segmented DAC. In this case, the divider circuit 804 is a resistor ladder circuit 804 with M−1 resistors R connected in series with one another to define the tap nodes 805 between resistors R. A decoder 801 provides switching control signals 802 to switches S of a switching circuit 806 to selectively connect selected ones of the tap nodes 805 to a corresponding one of the output lines 122-H or 122-L based on the first subword bits dacm<7:0>. Chopper circuits 808 are provided at the ends of the ladder circuit 804 between the end resistors R and the inputs 121-H, 121-L, with chopper resistor circuits and chopper switches operated according to the "chop" signal from the input 124. In one possible implementation, the remaining least significant bits (e.g., the remaining 4 bits for a 12-bit segmented DAC implementation or the 8 remaining bits for a 16 bit implementation) are provided as inputs to the SDM 136 to deliver an interpolation code ICODE to the input 130 of the interpolation DAC 126. In the resistor DAC 120 of FIG. 8, the decoder 801 implements swapping for selective connection of certain tap nodes 805 to either of the VH or VL output lines 122-H or 122-L, and any included OEM switching and the chopping function.

Figure 9:
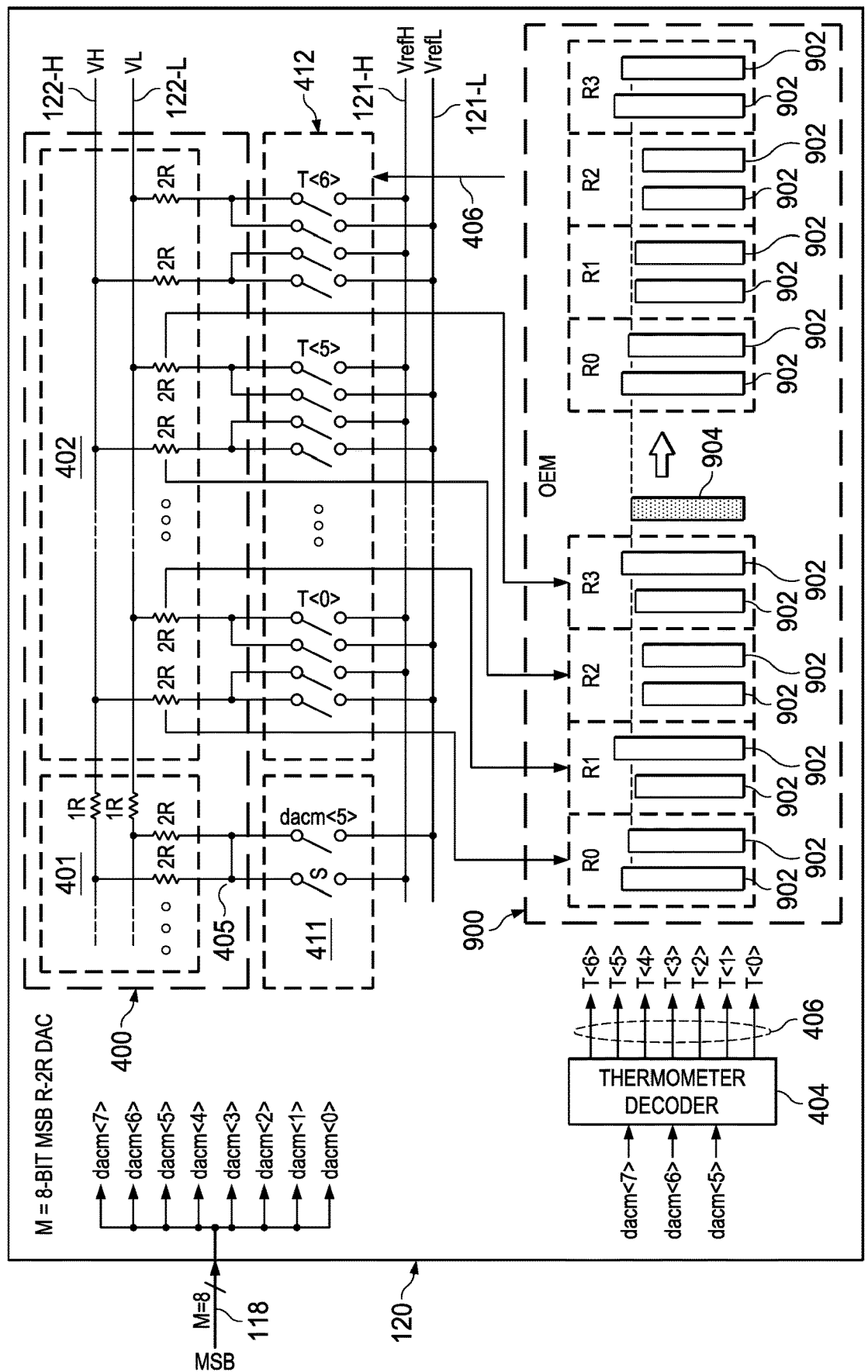
FIG. 9 is a schematic diagram of an example ordered element matching (OEM) circuit with seven OEM switching circuits in the MSB DAC of the segmented DAC.
Figure 10:
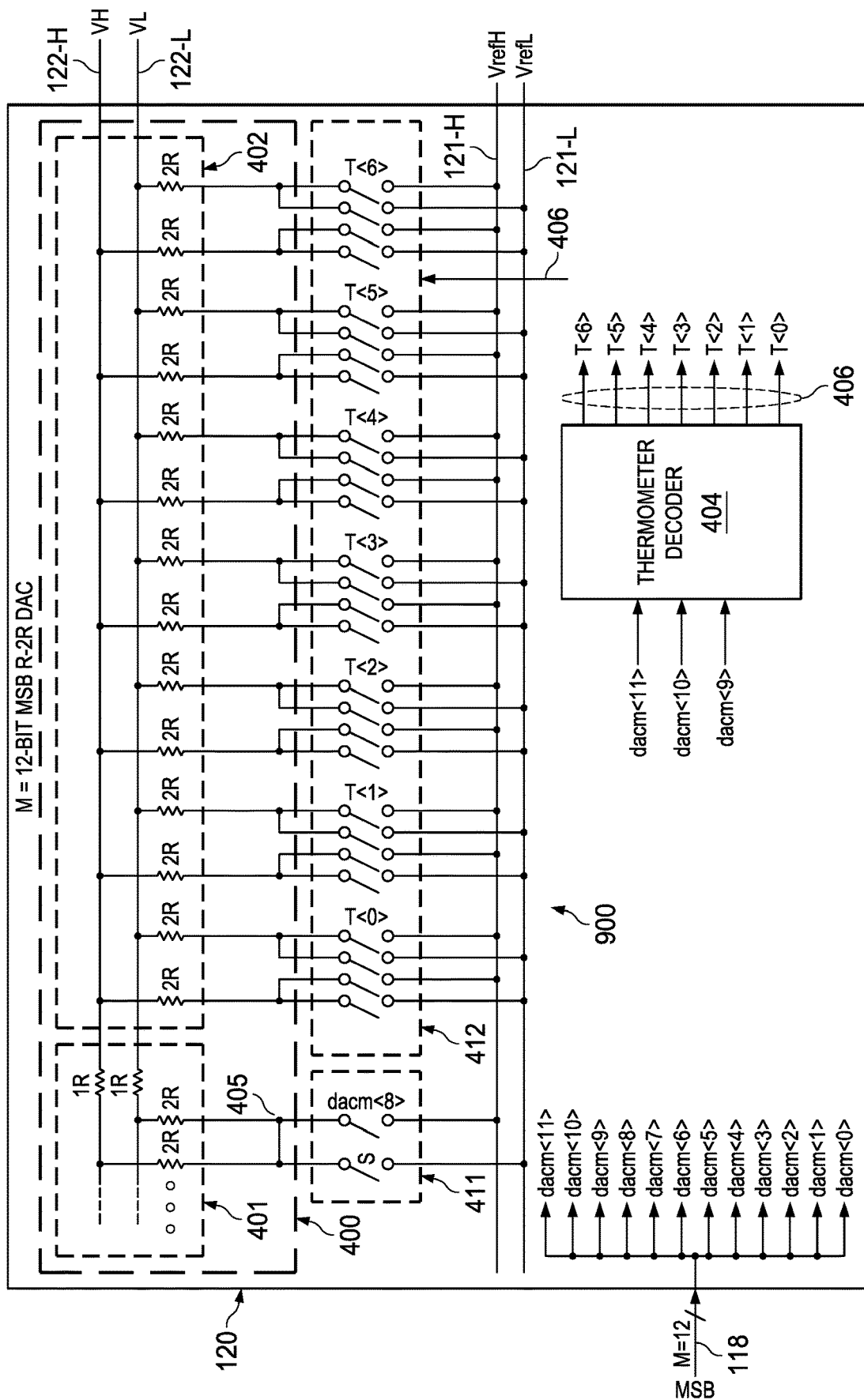
FIG. 10 is a schematic diagram of an example 12-bit resistor DAC with a 9-bit R-2R MSB DAC circuit and an example ordered element matching (OEM) circuit with seven OEM switching circuits.
Figure 11:
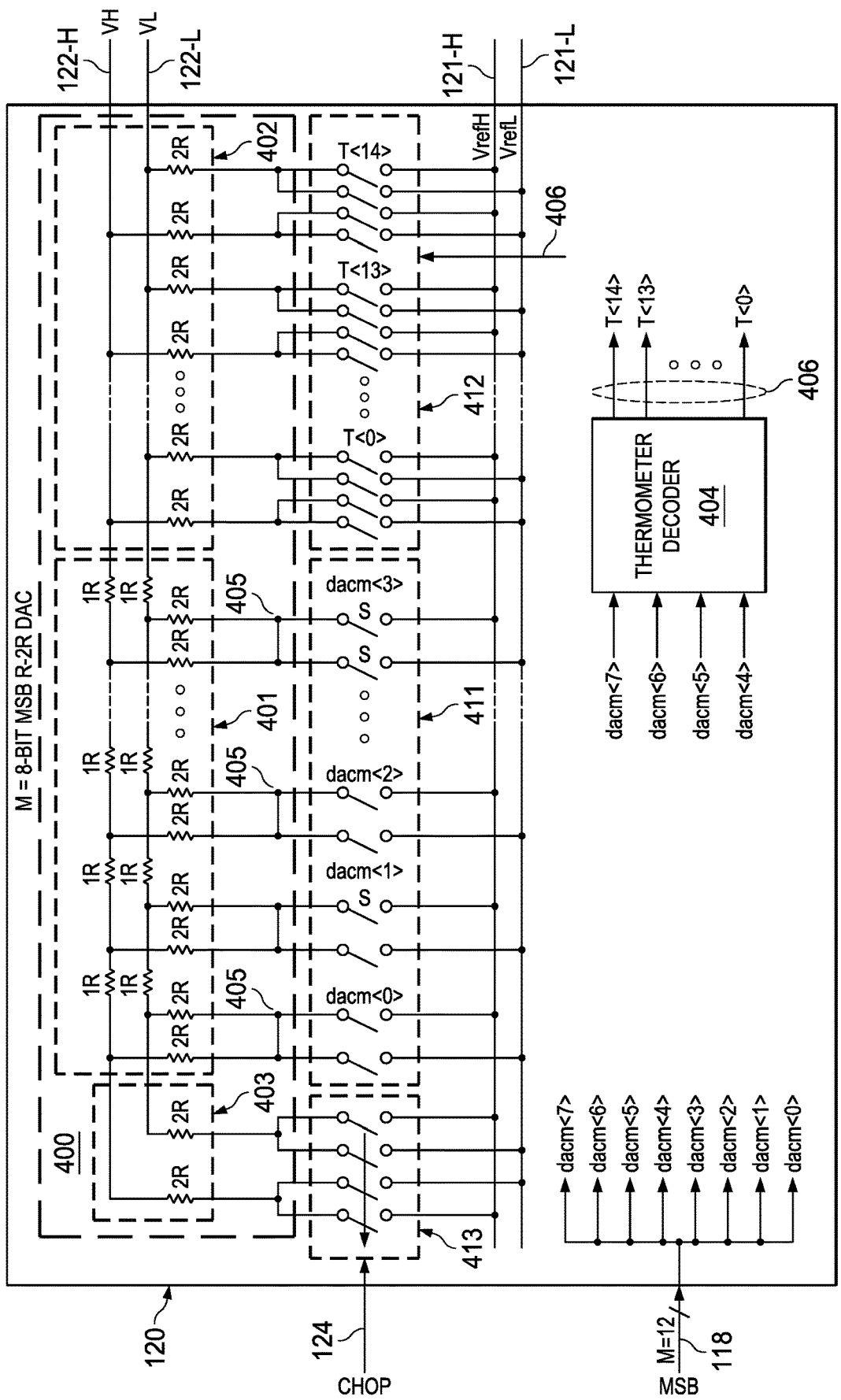
FIG. 11 is a schematic diagram of an example 8-bit resistor DAC with a 4-bit R-2R MSB DAC circuit and another example ordered element matching (OEM) circuit with fifteen OEM switching circuits in the MSB DAC of the segmented DAC.
Figure 12:
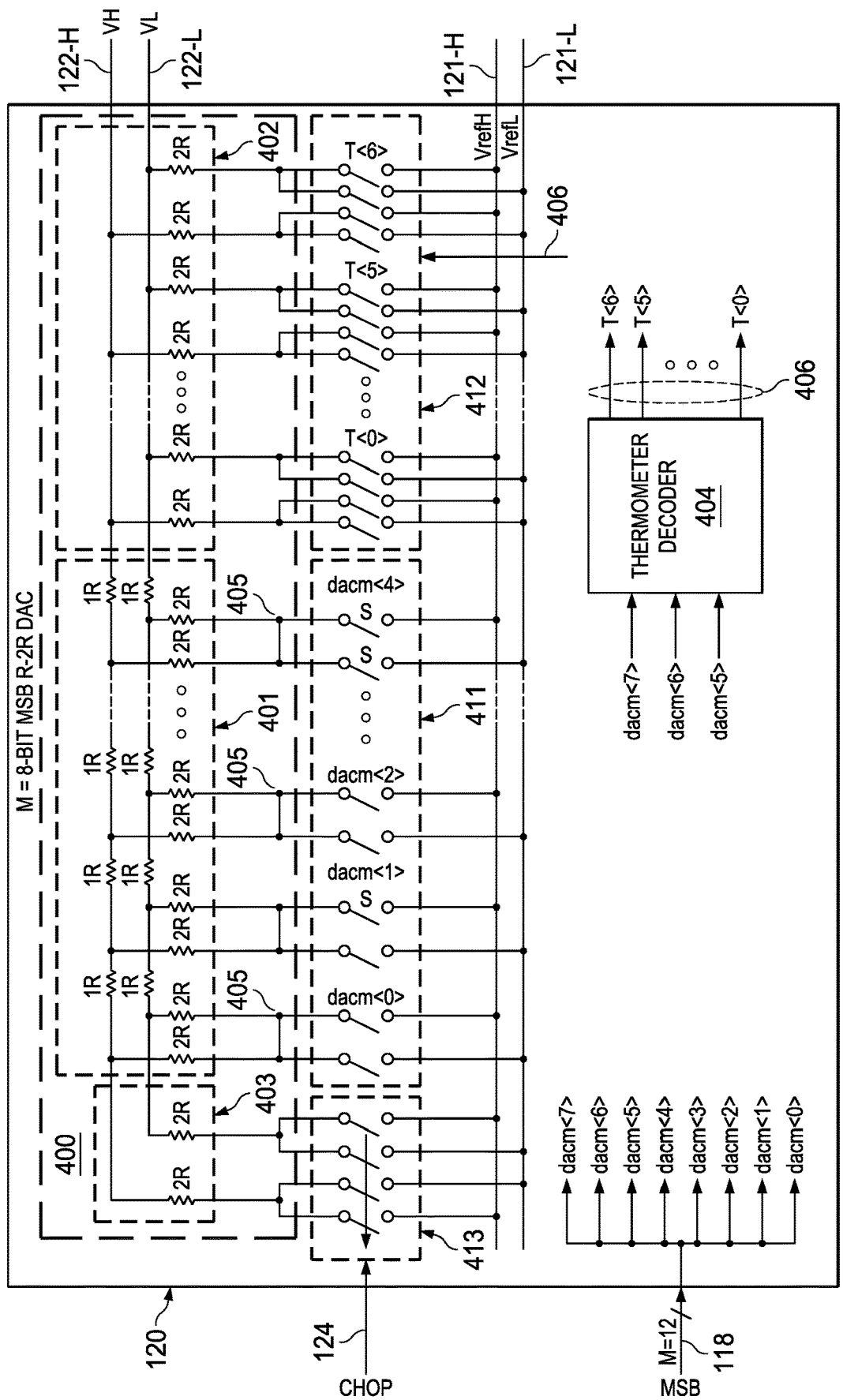
FIG. 12 is a schematic diagram of an example 8-bit resistor DAC with a 5-bit R-2R MSB DAC circuit and another example ordered element matching (OEM) circuit with seven OEM switching circuits in the MSB DAC of the segmented DAC.
Figure 13:
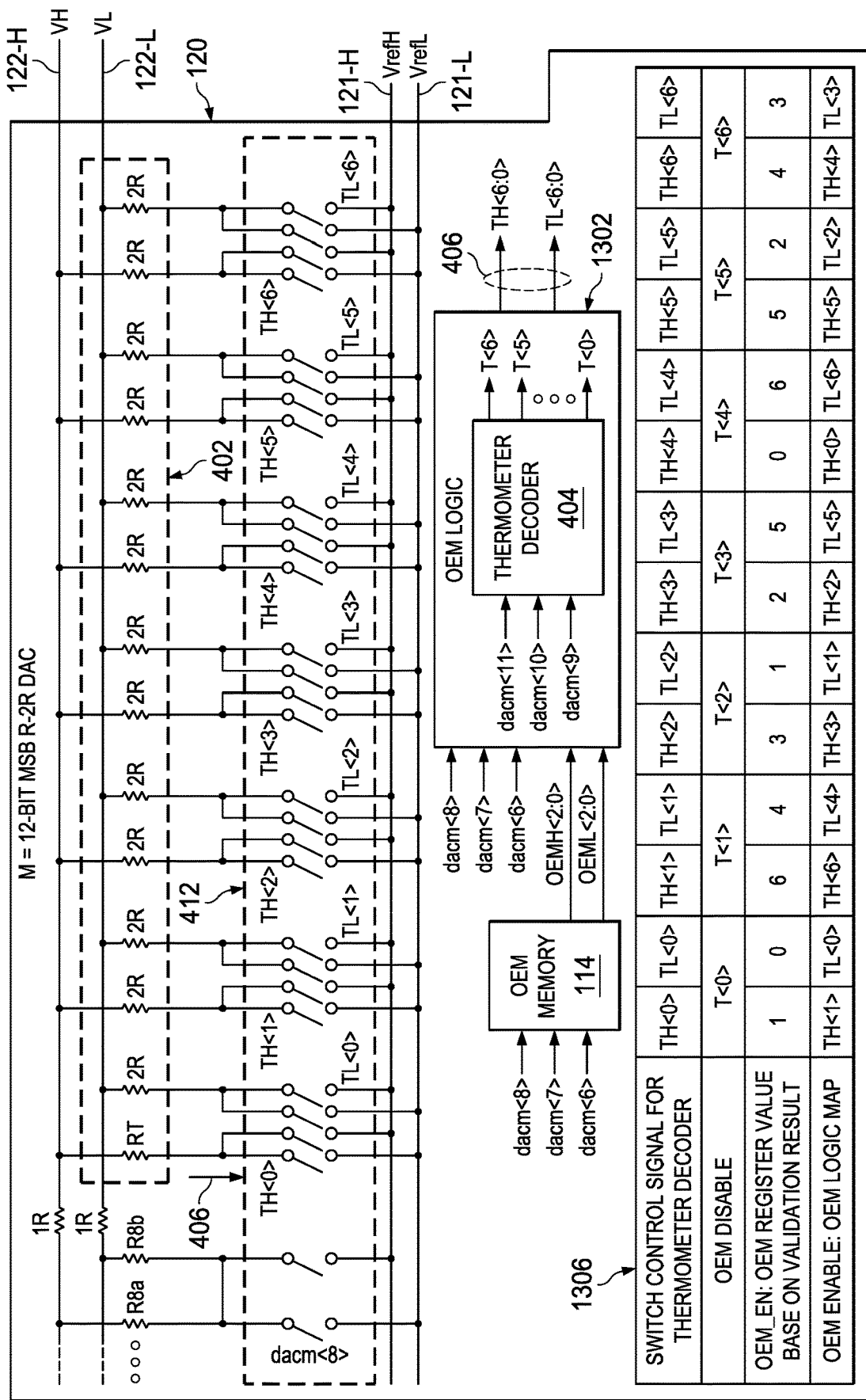
FIG. 13 is a schematic diagram of an example 12-bit resistor DAC with a 9-bit R-2R MSB DAC circuit and another example ordered element matching (OEM) circuit with seven OEM switching circuits in the MSB DAC of the segmented DAC.

Referring also to FIGS. 9 and 10, certain examples include ordered element matching (OEM) circuitry implemented in the OEM circuits 402 and 412. FIG. 9 shows an example ordered element matching (OEM) circuit 900 with seven OEM switching circuits in an R-2R MSB resistor DAC 120. In certain examples, the switching individual 2R elements of the OEM resistor circuit 402 include multiple resistor structures 902, many of which may not be of identical resistance to an ideal resistor unit 904. Corresponding switches in the OEM switching circuit 412 are operated based on the output signals 406 from the thermometer decoder 404. The average resistance of each group of resistor structures 902 (average of RH) associated with the high reference input 121-H is approximately equal to the that of the resistor structures 902 (average of RL) associated with the low reference input 121-L, and the averages of the deviations from the ideal value are approximately equal (e.g., (RH-Runit_ideal) is approximately equal to (Runit_ideal-RL)). The example ordered element matching circuit 900 of FIG. 9 can be used in one example in connection with the resistor DAC structure 120 of FIG. 4. In this example, the thermometer decoder 404 generates thermometer coded control signals 406 T<6:0> based on the first subword bits dacm<7:5>, and the OEM switching circuit 412 includes corresponding switches to implement ordered element matching. FIG. 10 shows another example OEM circuit implementation including 8 OEM switching circuits in the MSB resistor DAC 120. In this example, the thermometer decoder 404 generates thermometer coded control signals 406 T<7:0> based on the first subword bits dacm<11:9>. As with the example of FIG. 9, the OEM switching circuit 412 in FIG. 10 includes corresponding switches to implement ordered element matching functions. FIG. 11 shows an example 8-bit resistor DAC 120 with a 4-bit R-2R MSB DAC circuit and another example ordered element matching (OEM) circuit with fifteen OEM switching circuits in the MSB DAC of the segmented DAC. This example provides a 4-bit thermal decode along with a 4-bit binary decode configuration. FIG. 12 shows an example 8-bit resistor DAC 120 with a 5-bit R-2R MSB DAC circuit and another example ordered element matching (OEM) circuit with seven OEM switching circuits in the MSB DAC of the segmented DAC 100. This example provides a 3-bit thermal decode along with a 5-bit binary decode configuration. FIG. 13 shows another example 12-bit resistor DAC 120 with a 9-bit R-2R MSB DAC circuit and another example ordered element matching (OEM) circuit with seven OEM switching circuits in the MSB DAC of the segmented DAC 100. In this example, the OEM memory 114 receives the dacm<8:6> bits and provides high and low OEM control signals OEMH:2:0> and OEML<2:0>, respectively, to an OEM logic circuit 1302 that includes the thermometer decoder 404. The decoder 404 provides signals to the OEM circuit 412 as thermometer decoded signals T<6:0> by decoding dacm<11:9>. The OEM logic circuit 1302 provides high and low thermometer decoded signals TH<6:0> and TL<6:0> as the output signals 406 to the OEM circuit 412 based on a validation or calibration as shown in a table 1306 in FIG. 13. In one example, TH<6:0> can be swapped base on the validation result, TL<6:0> can be swapped base on the validation result, where R_TH<n>+R_TL<n> is close to an ideal unit resistor for n from 0 to 6.

Figure 14:
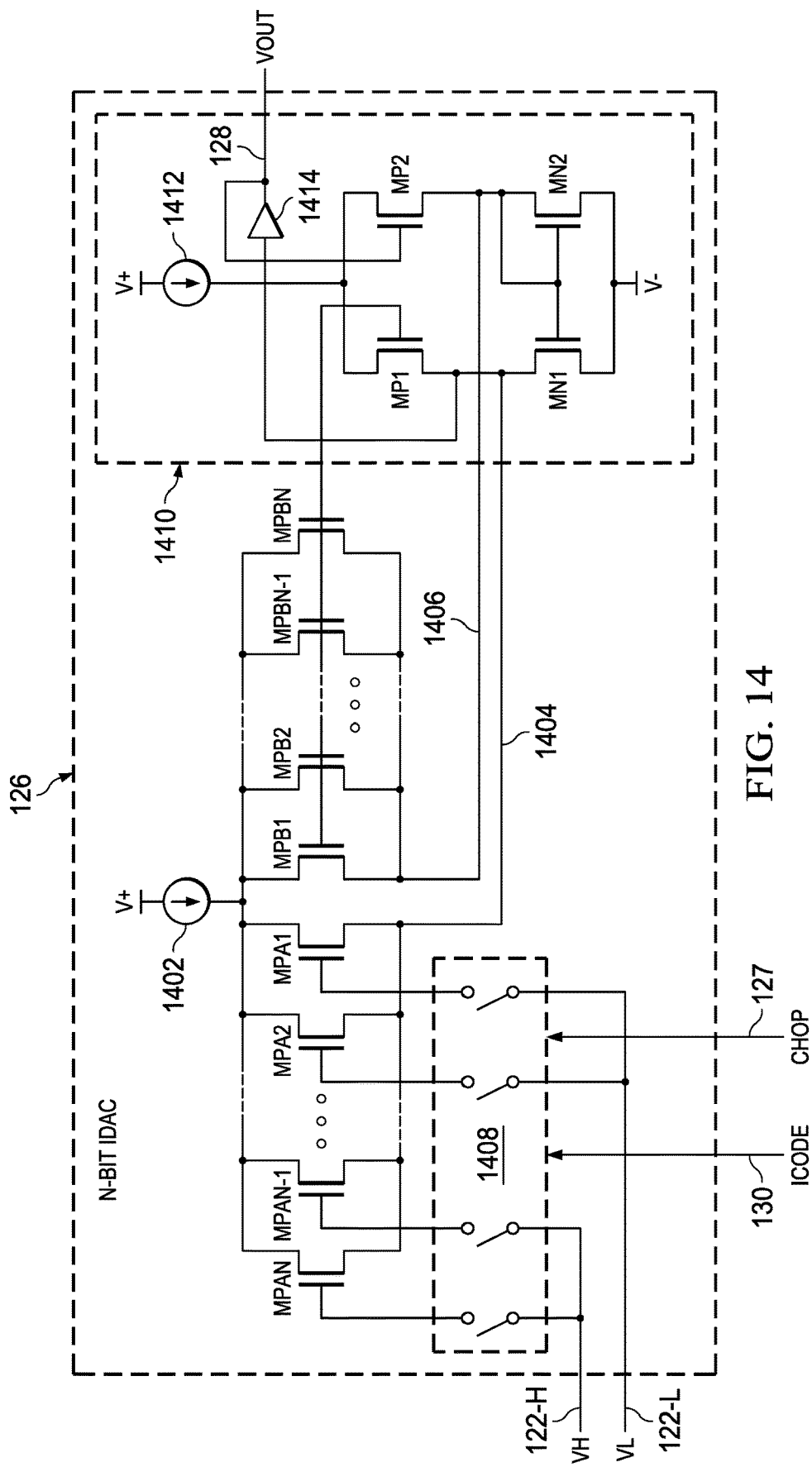
FIG. 14 is a schematic diagram of an example 4-bit interpolation DAC in the segmented DAC.

Referring also to FIGS. 14-21, any suitable N-bit interpolation DAC 126 can be used in the segmented DAC circuit 100, where N is an integer greater than 1. FIG. 14 shows an example 4-bit interpolation DAC 126. The circuit 126 includes a current source driven by a positive supply voltage V+ to provide a current to the sources of PMOS transistors include an integer number N matched pairs MPA1 and MPB1, MPA2 and MPB2, . . . , MPAN-1 and MPBN-1, and MPAN and MPBN. The transistors MPA are connected in parallel between the current source 1402 and a line or circuit node 1404, and the transistors MPB are connected in parallel between the current source 1402 and a second line 1406. An output stage MCX includes a second current source 1412 providing a current based on the positive voltage supply V+. The output stage in FIG. 14 includes PMOS transistors MP1 And MP2, as well as lower NMOS transistors MN1 and MN2. MP1 and MN1 are connected in series with one another in a first circuit branch between the current source 1412 and a second voltage supply V−, and the line 1404 is connected to the drains of MN1 and MP1. MP2 and MN2 are connected in series with one another in a second circuit branch between the current source 1412 and the supply voltage V−, and a node joining the drains of MP2 and MN2 is connected to the drains of the transistors MPB via line 1406. The output stage also includes a buffer amplifier 1414 which includes an input connected to the line 1404, and an output 128 to provide the analog output signal VOUT. The output 128 is connected to the gate of MP2, and the gate of MP1 provides the feedback signal to the gates of the transistors MPB1-MPBN. In certain examples, the switching circuit 1108 includes an input 127 and switches operated according to the interpolate or chopping control signal chop to implement copper functionality.

The gates of the transistors MPA are connected to individual switches of a switching circuit 1408. The gates of the transistors MPB are connected to one another to receive an output signal from the output stage 1410. The switches of the circuit 1408 are opened or closed based on the interpolation code signal ICODE to implement swapping based on selective connection to the first converter output lines 122-H or 122-L based on the interpolation code signal ICODE to determine whether the corresponding contribution of a given one of the transistors MPA is added to the current flowing in the line 1404. In this manner, the interpolation code determines whether the individual gates of the transistors MPA are connected to VH or to VL of the differential first analog output signal from the resistor DAC 120. In operation, the interpolation DAC 126 interpolates the output voltage VOUT between the taps of the resistor DAC 120 based on the interpolation code signal ICODE.

Figure 15:
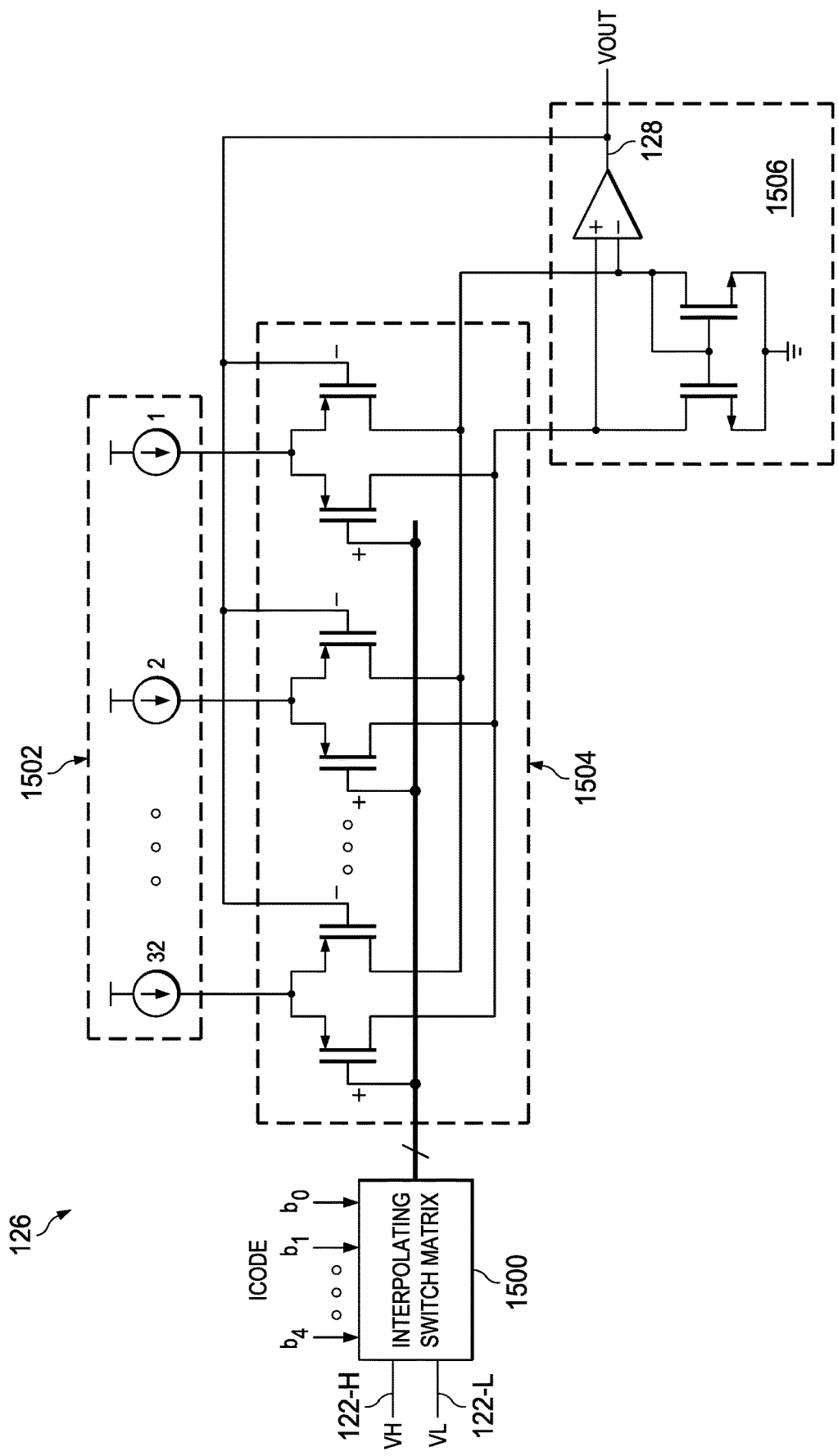
FIG. 15 is a schematic diagram of another interpolation DAC or interpolation amplifier DAC in the segmented DAC.
Figure 16:
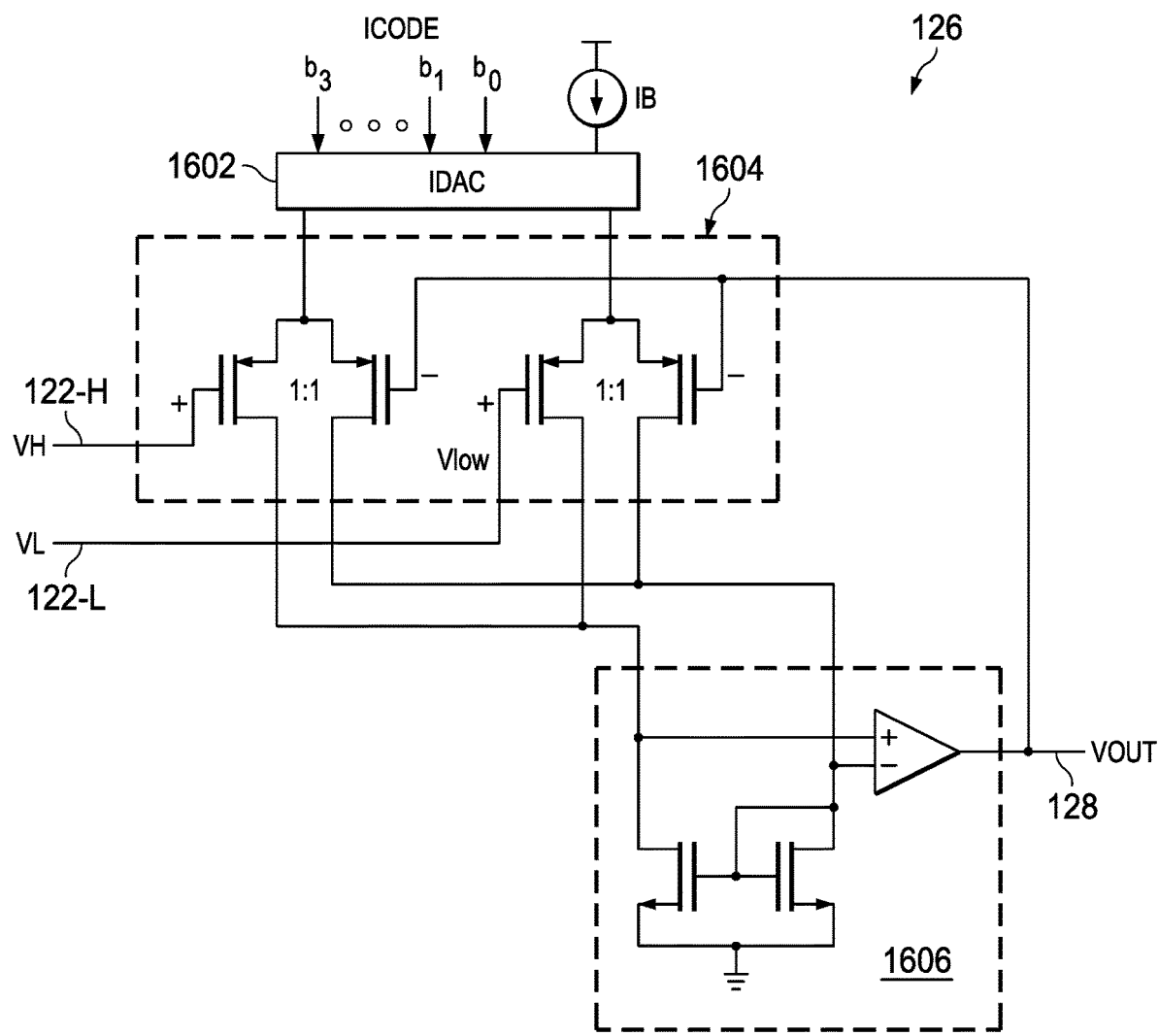
FIG. 16 is a schematic diagram of another interpolation DAC in the segmented DAC without chopper functionality.

FIG. 15 shows another interpolation DAC or interpolation amplifier DAC 126 in the segmented DAC 100. The interpolation DAC 126 in FIG. 15 includes an interpolation switch matrix 1500 that receives the first analog output signal (VH, VL) from the resistor DAC 120. The switch matrix 1500 in this example generates a 32-bit digital output with individual bits connected to the left side of one of 32 individual differential pair stages in a differential pair circuit 1504. The individual differential pair's in the circuit 1504 are biased by a corresponding one of 32 current sources in a current source circuit 1502. The interpolation DAC 126 in this case has an output stage MDVI that provides the output signal VOUT at the output terminal 128. FIG. 16 shows another interpolation DAC example 126 in the segmented DAC circuit 100. The interpolation DAC 126 of FIG. 16 includes a single current source providing a bias current IB to an interpolation DAC switching circuit 1602 operated according to the interpolation code ICODE to selectively provide binary weighted amounts of the bias current IB to one of a pair of differential pairs of a differential pair circuit 1604. The positive (+) input of the first differential pair is connected to the node 122-H to receive the VH signal from the MSB DAC 120. The positive (+) input of the second differential pair is connected to the node 122-L to receive the VL signal, and the negative (−) differential pair inputs are connected to the node 128 to receive the output voltage signal VOUT as feedback from an output stage 1606. The interpolation DAC 126 of FIG. 16 advantageously reduces the number of differential pair circuits to reduce the associated switch leakage at the differential pair inputs compared with the interpolation DAC topologies of FIGS. 14 and 15.

Figure 17:
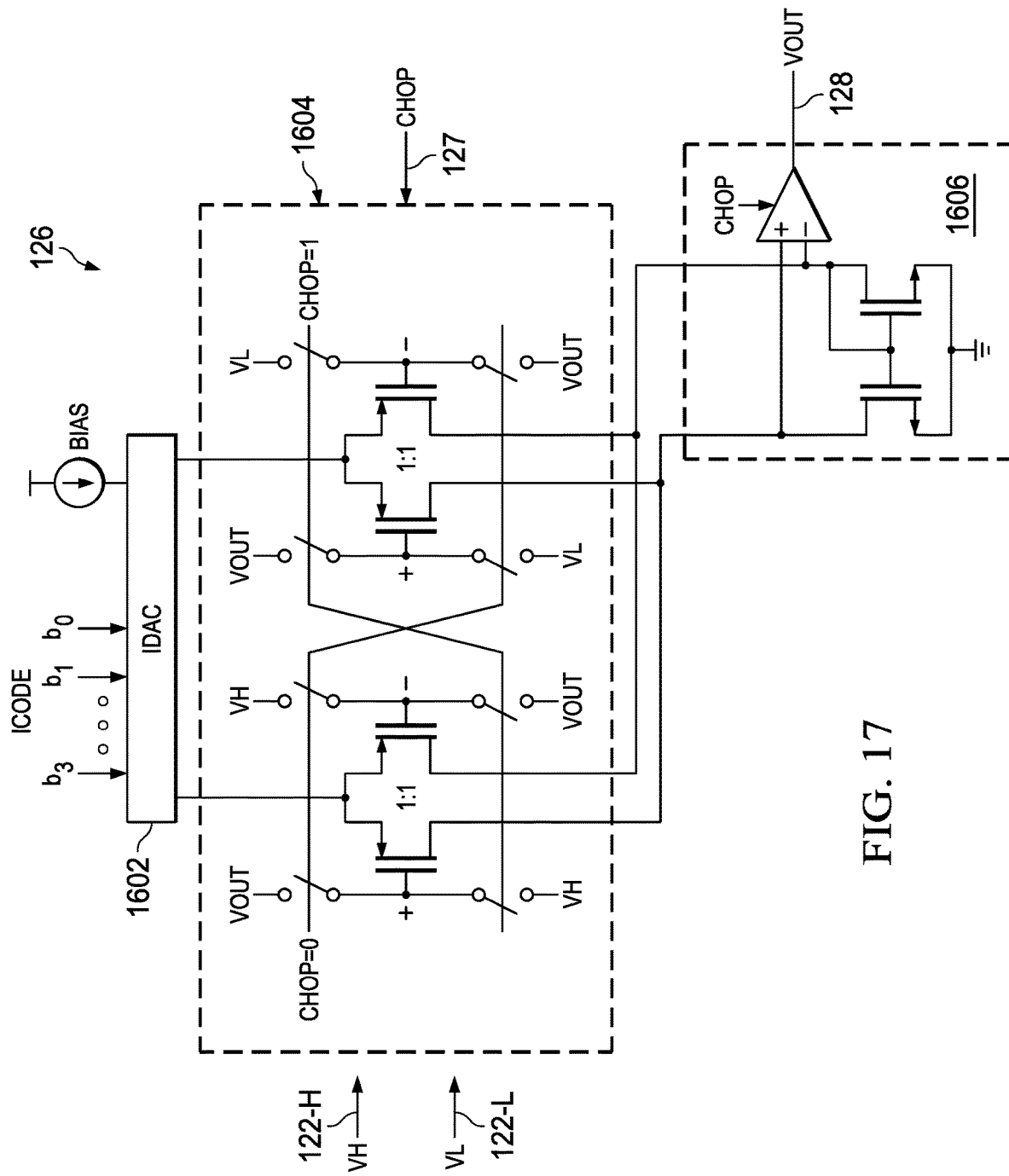
FIG. 17 is a schematic diagram of another interpolation DAC in the segmented DAC with chopper functionality.

FIG. 17 another low switch leakage interpolation DAC 126 that includes a single current source to bias an interpolation DAC switching circuit 1602 which operates according to the interpolation code ICODE. The DAC 126 in FIG. 17 also includes a differential pair circuit 1604 with two differential pairs as described above in connection with FIG. 16, and an output stage MDCVI to provide the output voltage signal VOUT. The interpolation DAC 126 in FIG. 17 further includes chopper functionality, with switches in the provide selective connections to swap the positive (+) and negative (−) inputs of the two differential pairs in the circuit 1604 according to the chop input signal at the input 127.

Figure 18:
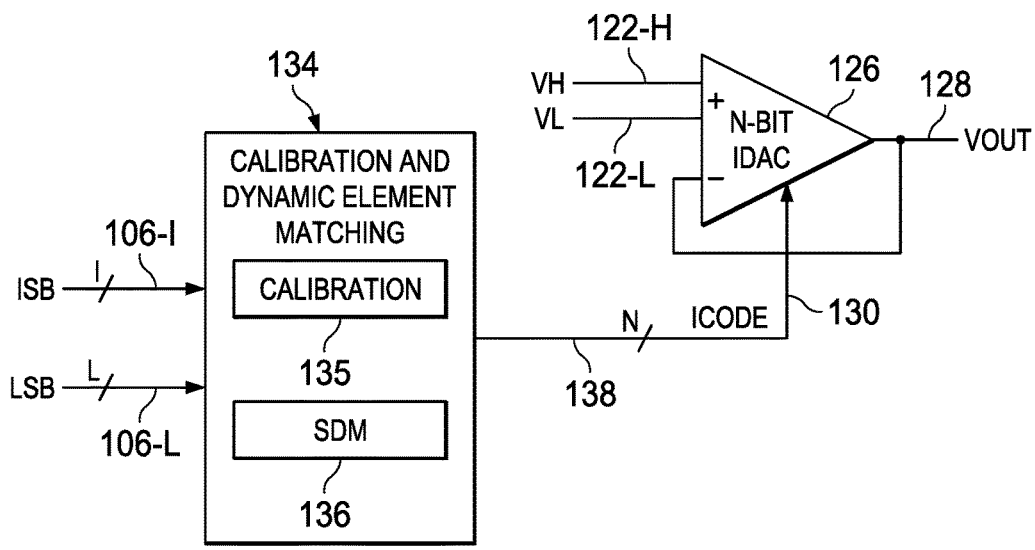
FIG. 18 is a schematic diagram of an example Sigma Delta modulator (SDM) and dynamic element matching (DEM) to provide a 4-bit Sigma Delta code to the interpolation DAC in the segmented DAC.
Figure 19:
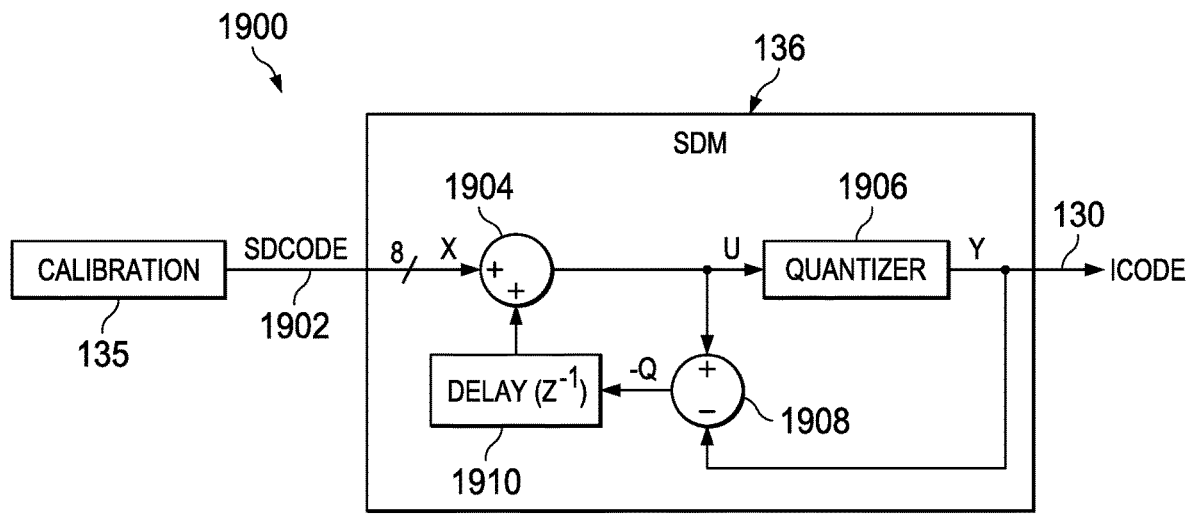
FIG. 19 is a schematic diagram of a noise shaping model illustrating operation of the Sigma Delta modulator in the segmented DAC.

FIG. 18 shows an example SDM circuit 136 and dynamic element matching (DEM) to provide a 4-bit Sigma Delta code to the interpolation DAC 126 in the segmented DAC circuit 100, and FIG. 19 shows a noise shaping model 1900 illustrating operation of one example SDM 136. The calibration component 135 in one example provides the modulator code SDCODE to an input 1902 of the SDM 136. The input 1902 in one example is an 8-bit input provided to a summer component 1904. An output of the summer component 1904 provides an input to a quantizer 1906. The output of the quantizer is connected to the SDM output and the input 130 of the interpolation DAC 126 to provide the N-bit interpolation code ICODE. The multiplexer 140 in FIG. 1 is omitted from the simplified schematic of FIG. 18. In one example, the interpolation code ICODE is a 4-bit digital signal, but other values of N can be implemented in other examples. The quantizer output code ICODE is subtracted from the output of the summer component 1904 by a second summer component 1908 to provide an input to a delay unit 1910. The delay unit output is added to the modulator code SDCODE by the first summer component 1904. The SDM 136 delivers the N-bit interpolation code in this example based on the N-bit second and third subwords ISB and LSB, where N is less than I+L.

The input to the first summer component 1904 is labeled "X", and the output of the first summer component 1904 is labeled "U". In addition, the quantizer output is labeled "Y" and the delay input is labeled "−Q" in FIG. 19. The SDM 136 operates to modulate the received modulator code SDCODE (e.g., 8-bits in one example), with the quantizer 1906 providing the output code as an input to the interpolation DAC 126. The operation of the SDM 136 is illustrated by the following formulas:

$$U_{(n)} = X_{(n)} - Q_{(n-1)}.$$

$$Q_{(n)} = Y_{(n)} - U_{(n)}.$$

$$Y_{(n)} = X_{(n)} - Q_{(n-1)} + Q_{(n)} = X_{(n)} + Q_{(n)} - Q_{(n-1)}.$$

$$Q_{(n)} - Q_{(n-1)} = (1 - Z^{-1}) * Q.$$

$$Y = X + (1 - Z^{-1}) * Q.$$

Figure 20:
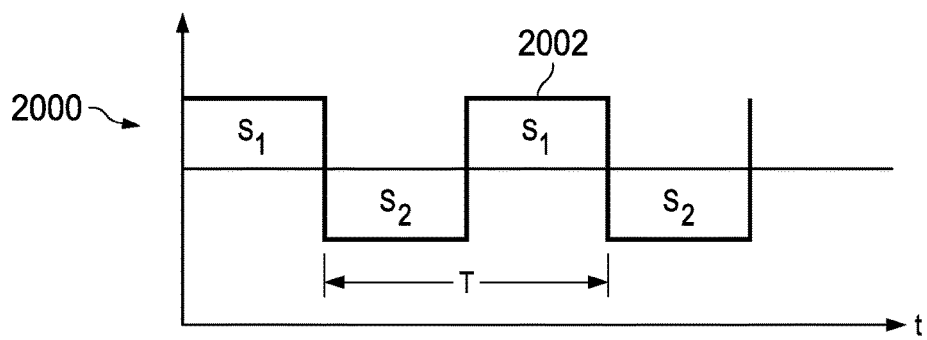
FIG. 20 is a graph of an example chop signal for dynamic element matching in the segmented DAC.

FIG. 20 shows a graph 2000 including an example signal waveform 2002 showing the chop signal in certain implementations of the segmented DAC 100 as a function of time. In the illustrated example, the chop signal is used to control alternate selection of one of two switches $S_1$ and $S_2$ in order to perform dynamic element matching by alternating selection of one of two circuit components or elements. For example, the MSB resistor DAC 120 in FIG. 4 receives a chop signal at the input 124 and is used to selectively switch from one or more pairs of switches according to the signal, where FIG. 20 illustrates an example 50% duty cycle signal waveform 2002 for the chop signal. In this example, the chopping frequency is the inverse of the switching period T shown in the graph 2000. The chop signal can also or alternatively be used for chopping functions in the interpolation DAC 126 (e.g., FIG. 17), where the signal waveform 2002 can be applied to the input 127.

Figure 21:
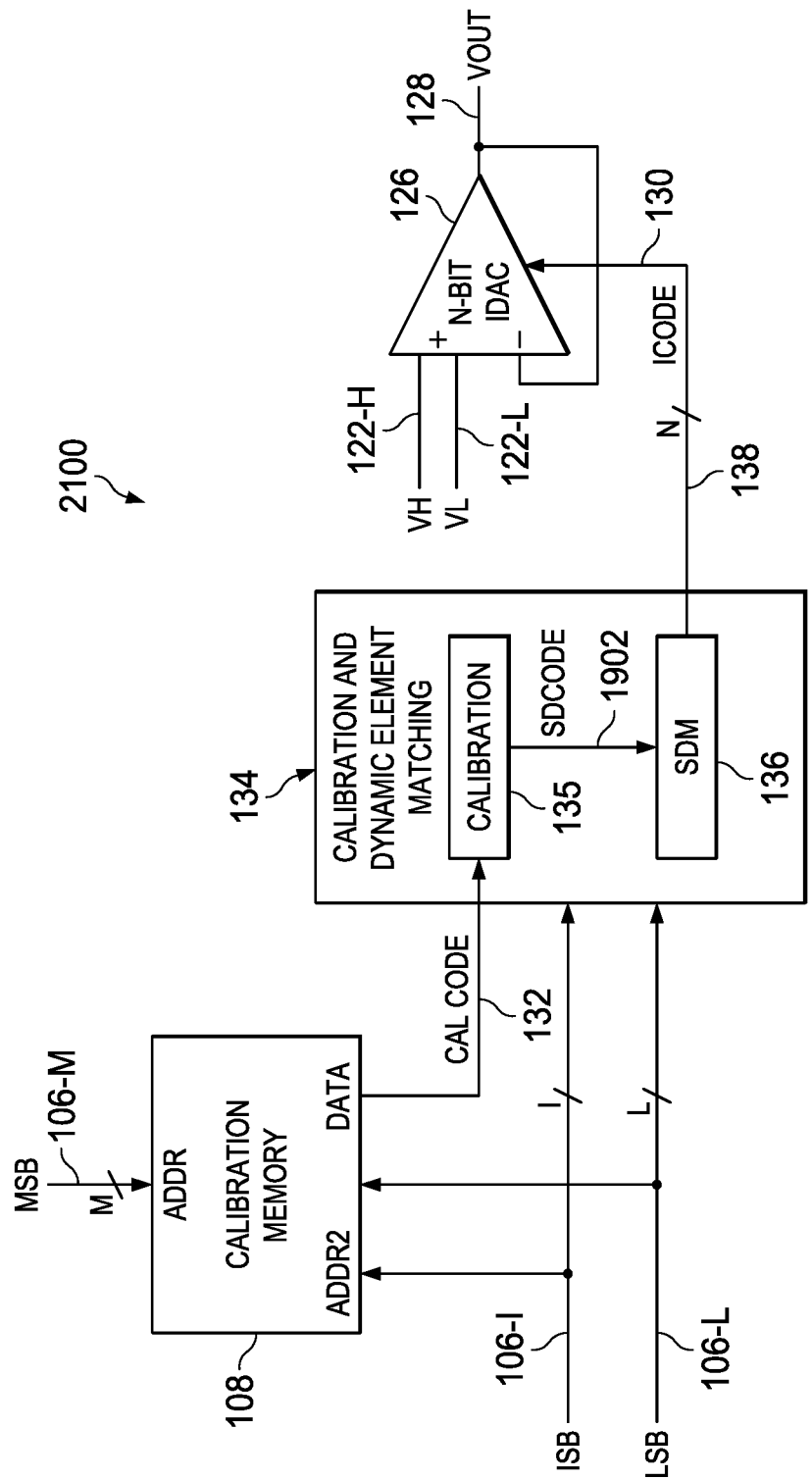
FIG. 21 is a schematic diagram of an example calibration circuit implementation in the segmented DAC.

FIG. 21 shows an example calibration in the segmented DAC. The calibration in one example achieves INL<+/−1LSB, as well as DNL<+/−1LSB and +/−32LSB calibration range with +/−¼ calibration step. In one example, the calibration memory requirements are 8×9-bits of memory 108 for MSB calibration, 16×7-bits of memory for ISB calibration, using a 16-bit DAC LSB-Vref/$2^{16}$. The calibration uses a ¼ LSB calibration step over a +/−32-bit calibration range for a 16 bit segmented DAC circuit 100, where the calibration LSB_calibration=Vref/$2^{18}$=LSB_dac 16/4. The calibration code range is +/−128, and the DAC_ISB is thermometer decoded from dac<7:4>. An example set of calibration data is shown in the following Table 1:

TABLE 1

| | MSB7 | MSB6 | MSB5 | MSB4 | MSB3 | MSB2 | MSB1 | MSB0 | Unit |
|---|---|---|---|---|---|---|---|---|---|
| Calibration Code +/−32LSB_dac16 | 65 | 98 | −79 | 46 | −33 | 23 | 16 | −14 | LSB_calibration |

TABLE 1-continued

| | ISB7 | ISB6 | ISB5 | ISB4 | ISB3 | ISB2 | ISB1 | ISB0 | Unit |
|---|---|---|---|---|---|---|---|---|---|
| Calibration Code +/−32LSB_dac16 | 25 | 24 | −16 | 12 | −7 | −11 | 12 | −15 | LSB_calibration |
| | ISB15 | ISB14 | MIB13 | ISB12 | ISB11 | ISB10 | ISB9 | ISB8 | Unit |
| Calibration Code +/−32LSB_dac16 | 6 | −8 | 19 | −21 | 15 | 14 | 16 | −17 | LSB_calibration |

Figure 22:
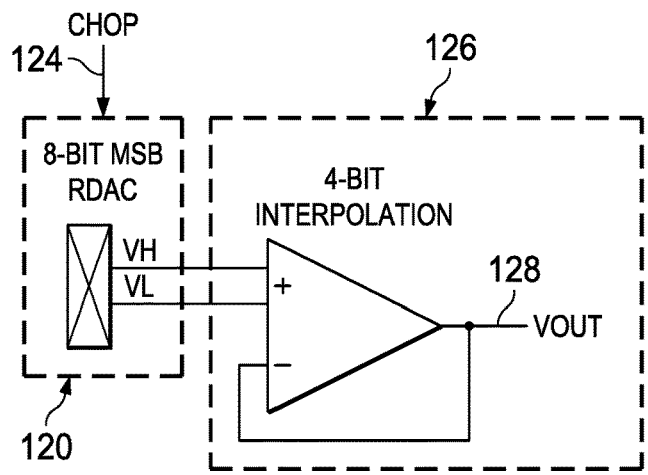
FIGS. 22-24 are schematic diagrams of example chopper functionality used in association with the MSB resistor DAC and/or the interpolation DAC in the segmented DAC.
Figure 23:
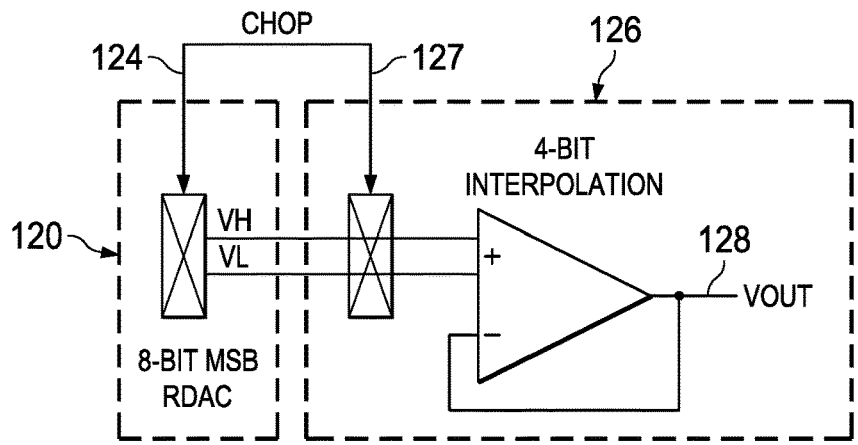
Figure 24:
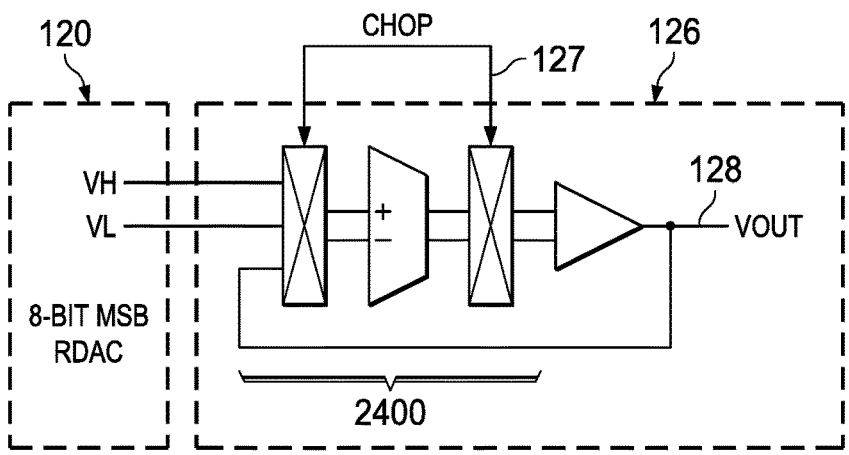

FIGS. 22-24 illustrate example chopper functionality in the segmented DAC. FIG. 22 illustrates application of the chop signal to the resistor DAC 124 swapping the interconnection of the first analog output signal lines 122 between the output of the resistor DAC 120 and the interpolation DAC 126. In FIG. 22, the chop signal is provided at the input 124 to the resistor DAC 120 to switch the VH and VL signals provided to the input of the interpolation DAC 126. In FIG. 23, the chop signal is provided to the resistor DAC input 124 and to the chopper input 127 of the interpolation DAC circuit 126 to switch the VH and VL signals provided to the interpolation DAC circuit. The Examples of FIGS. 22 and 23 provide resistor DAC chopping. FIG. 24 shows another example including a chopper amplifier circuit 2400 providing first and second signals to the input of the interpolation DAC 126.

Referring now to FIGS. 25-45, FIG. 25 shows a DAC calibration method or process 2500. The method 2500 provides calibration for a DAC circuit that converts a K-bit digital input signal (e.g., CODE above) that includes an M-bit first subword MSB that includes a most significant bit of the digital input signal, an I-bit second subword ISB, and an L-bit third subword LSB that includes the least significant bit of the digital input signal. The method 2500 in one example is implemented during manufacturing of the segmented DAC circuit 100. The calibration method 2500, moreover, provides significant advantages with respect to calibration memory utilization and calibration time compared with traditional calibration processes. FIG. 26 shows a traditional calibration method 2600, including measuring the INL and DNL of a DAC system at 2610, trimming a calibration DAC at 2622, calibrating the DAC and recording a calibration code in a memory at 2620, and measuring the DAC INL and DNL after calibration at 2630. In contrast, the illustrated method 2500 does not require trimming of a calibration DAC, and can be implemented using significantly less calibration memory than traditional techniques.

The method 2500 includes measuring DAC output voltages at 2502, including output voltages of a resistor DAC for a corresponding set of values of a first subword, measuring output voltages of an interpolation DAC for a corresponding set of values of a second subword, and measuring output voltages of an SDM for a corresponding set of third subword values. At 2510, the method includes calculating an output voltage value based on the measured output voltages. At 2520, the method provides for calculating calibration codes for the resistor DAC, the interpolation DAC, and the SDM, as well as calculating and storing a K-bit calibration code for the DAC circuit based on the calibration codes. Thereafter at 2530, the method includes calculating a calibrated DAC INL and DNL. FIGS. 27-29 show example MSB, ISB and LSB measurements in the calibration method 2500 of FIG. 25.

The method 2500 is described in the context of a 16-bit segmented DAC circuit 100 as described above, including an M=8-bit first subword MSB, an I=4-bit second subword ISB and an L=4-bit third subword LSB, but the method 2500 can be used in connection with calibration of other segmented DAC systems having other values for M, I and/or L. The output voltage measurements at 2502 in this example include measuring M+1 output voltages VH_MSB, VL_MSB of an M-bit resistor DAC 120 at 2504 for a corresponding set of M+1 values of the first subword MSB. In the illustrated example, the set of M+1 values of the first subword MSB includes a first set with all bits set to 0 and M values in which only a single bit is set to 1. FIG. 27 shows one example of the operation at 2504, including an example set 2704 of M+1 values of the first subword b<15:8> and corresponding VH and VL measured voltages. As seen in FIG. 27, only nine values of the first subword MSB need to be evaluated for measurements at 2504. This significantly saves measurement time compared with conventional resistor ladder DACs of a segmented DAC system.

The method 2500 continues at 2506 with measurement of $2^I$ (=16) output voltages VOUT_ia_ISB of the I-bit interpolation DAC 126 for a corresponding set of $2^I$ unique values of the second subword ISB. FIG. 28 shows an example of the processing at 2506, including an example set of all the 16 unique values of the 4-bit second subword (dac<7:4>) and corresponding measured voltages VOUT_ia_ISB. The measurements further include measuring $2^L$ output voltages Vout_sd at 2508 for the L-bit Sigma Delta modulator SDM 136 for a corresponding set of $2^L$ unique values of the third subword LSB. FIG. 29 shows an example of the processing at 2508, including the set of all the 16 unique values of the 4-bit third subword LSB (dac <3:0>) and corresponding measured voltages Vout_sd.

The method 2500 continues at 2512 in FIG. 25, including calculating a K-bit output voltage value DAC Vout based on the measured output voltages VH_MSB, VL_MSB, VOUT_ia_ISB and Vout_sd. FIG. 30 shows an example of the processing at 2512, including calculating an 8-bit MSB DAC output voltage at 2512-1 using the formulas 2001, as well as calculating and 8-bit MSB DAC+4-bit ISB output voltage at 2512-2 using the formulas 3002, and calculating the 16-bit output voltage including the 8-bit MSB+4-bit ISB+4-bit LSB outputs using illustrated formulas 3003.

Figures 31, 32:
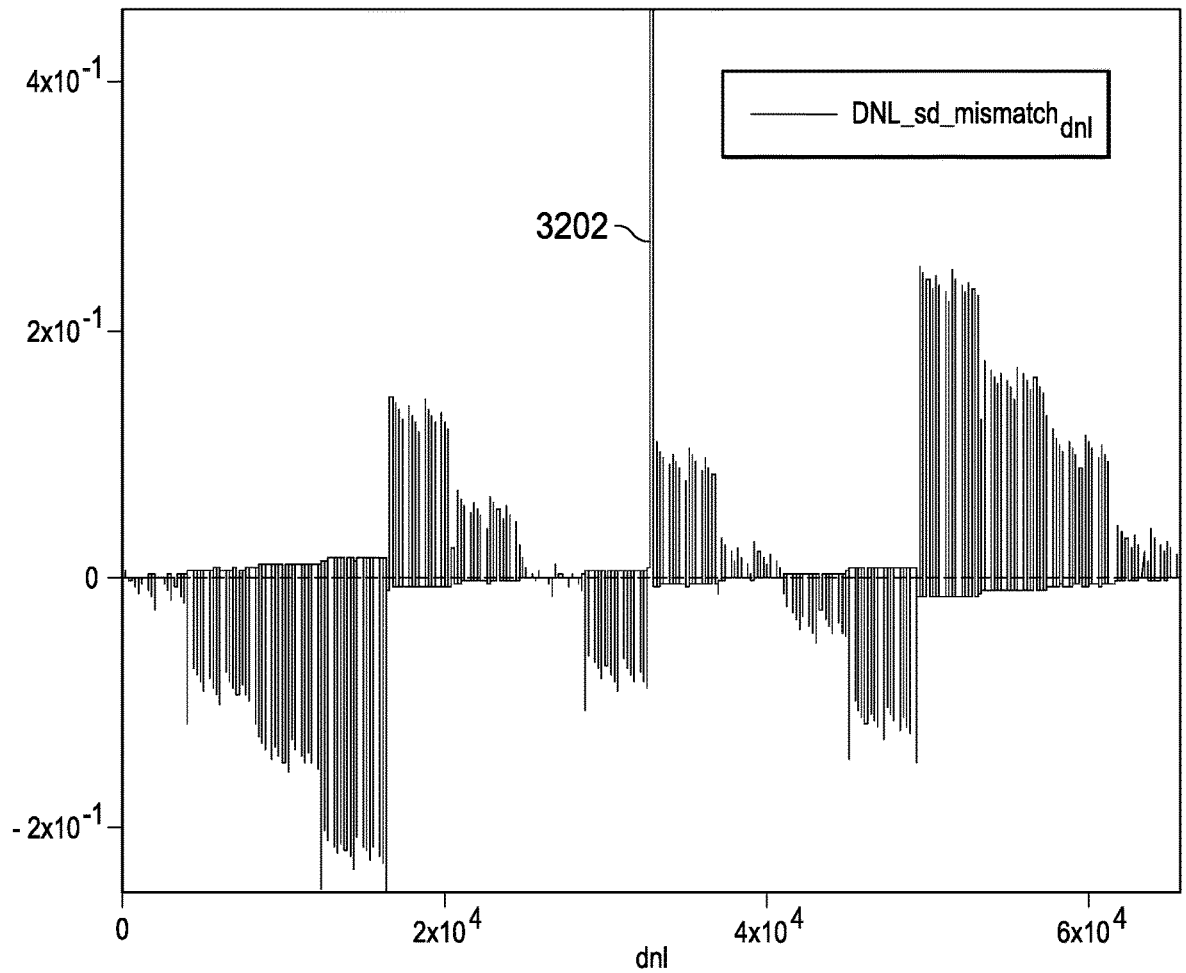
FIG. 31 is a partial schematic diagram showing example calculations of DNL and INL performance of a 16-bit DAC in the calibration method of FIG. 25.
FIG. 32 is a graph of DNL performance computed in FIG. 31.
Figure 33:
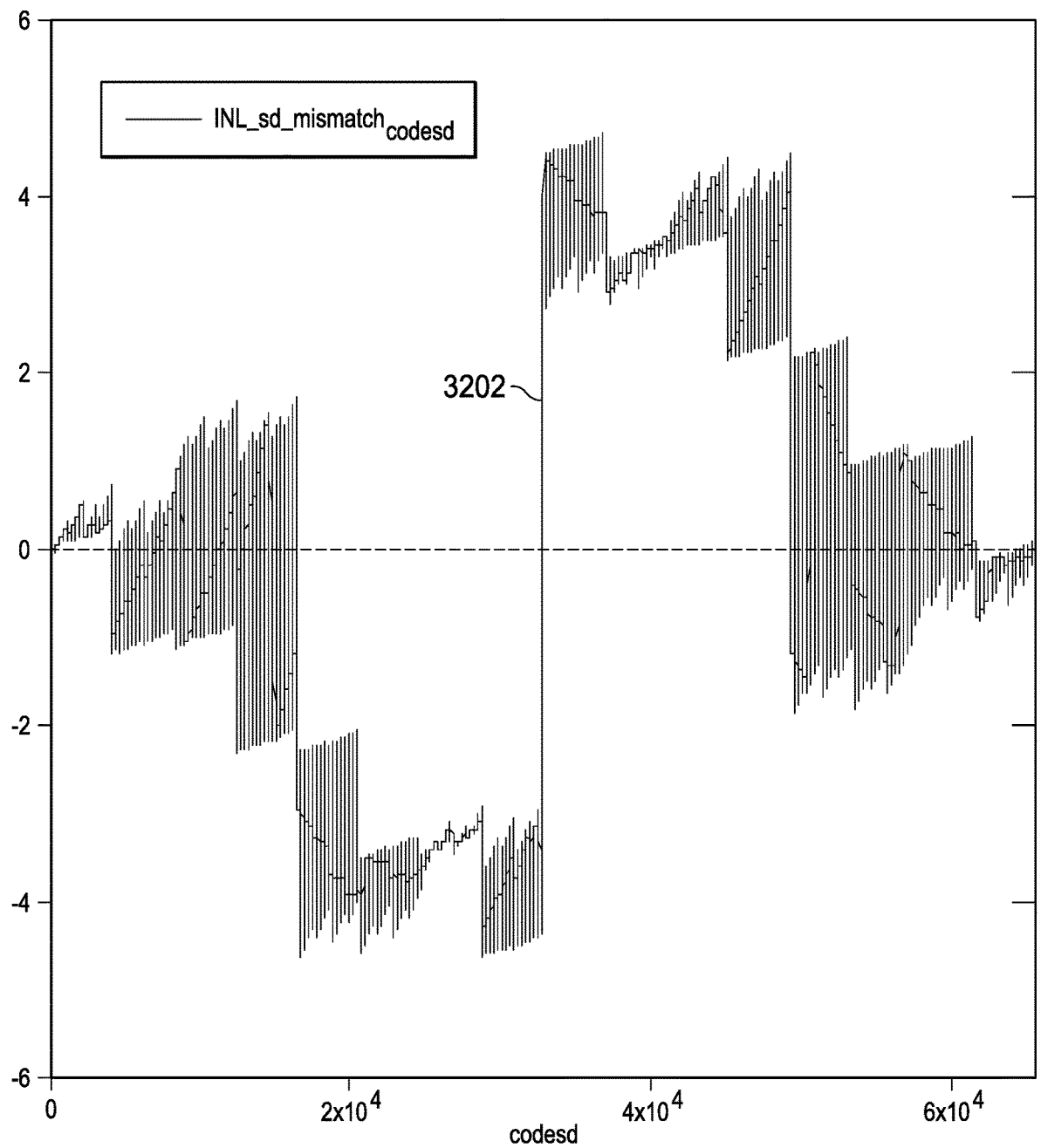
FIG. 33 is a graph of INL performance computed in FIG. 31.

The method 2500 in FIG. 25 also includes calculating an integral nonlinearity value INL, and a differential nonlinearity value DNL at 2514 based on the K-bit output voltage value DAC Vout computed at 2512. FIG. 31 shows example calculations 3102 of DNL and INL performance of a 16-bit DAC at 2514 in one example implementation of the calibration method 2500. FIG. 32 provides a graph 3200 showing the DNL performance curves 3202, and FIG. 3 provides a graph 3300 showing an INL performance curve 3302 computed at 2514 using the calculations 3102 of FIG. 31.

Continuing in FIG. 25, the processing at 2520 in one example includes calculating calibration codes CAL_MSB, CAL_ISB, CAL_LSB for the resistor DAC 120, the interpolation DAC 126, and the SDM 136 at 2522, 2524 and 2526, respectively. FIG. 34 illustrates an example of the processing at 2520, including computation formulas 3402. This example includes calculating the 8-bit MSB calibration code code_8_bits_MSB at 2522 according to the following formula: code_8_bits_MSB=(VH-VL_ideal)/(0.25*lsb), for ISB=VREF/216. FIG. 34 illustrates an example set of M+1 values of the first subword MSB (dac<15:8>), together with a corresponding VH and VL measured values and the offset values (VH-VL_ideal). In one example implementation, table 3402 in FIG. 34 shows a computed 8-bit MSB calibration code.

At 2524 in FIG. 25, the method 2500 includes calculating a 4-bit ISB calibration code "code_8_bits_ISB" according to the following formula: code_8_bits_ISB=(Vout_ia_ISB-Vout_ia_ISB ideal)/(0.25*lsb). FIG. 35 shows example computations 3502 and resulting example 4-bit ISP calibration code values in one example implementation of the processing at 2524 of FIG. 25.

Figures 36, 37:
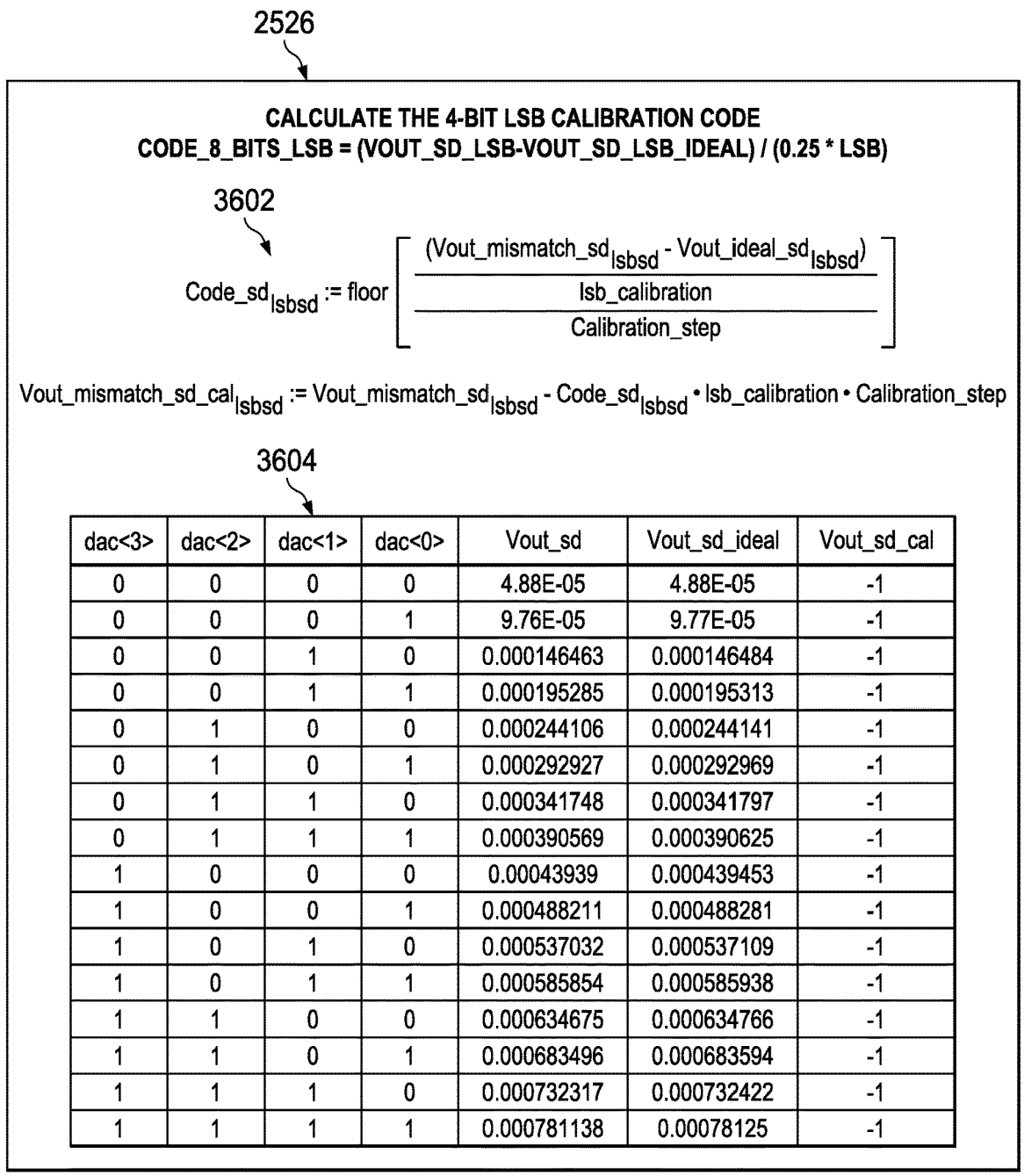
FIG. 36 is a partial schematic diagram showing further example calculation of recorded calibration DAC codes in the calibration method of FIG. 25.
FIG. 37 is a partial schematic diagram showing other example calculation of recorded calibration DAC codes in the calibration method of FIG. 25.
Figure 38:
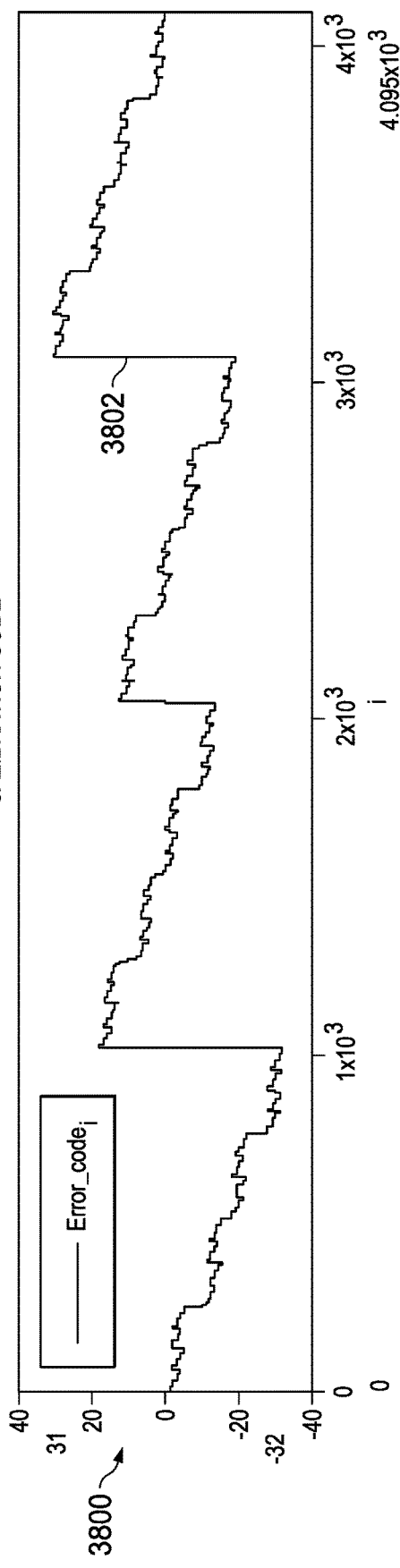
FIG. 38 is a graph of an example calibration code.

The method 2500 also includes calculating a K-bit calibration code for the DAC circuit 100 at 2526 based on the calibration codes CAL_MSB, CAL_ISB, CAL_LSB for the resistor DAC 120, the interpolation DAC 126, and the SDM 136. FIG. 36 shows example computations 3602 and resulting 4-bit computed LSB calibration code 3604 in one implementation of the processing at 2526. The K-bit calibration code is then stored in the calibration memory 108 at 2528 in FIG. 25. FIG. 37 illustrates example processing computations 3702 at 2528 in which the algorithm can be repeated to calculate the 16-bit DAC calibration code. The calibrated 16-bit DAC INL and DNL values can then be calculated at 1530 to complete the process 2500 of FIG. 25.

Figure 39:
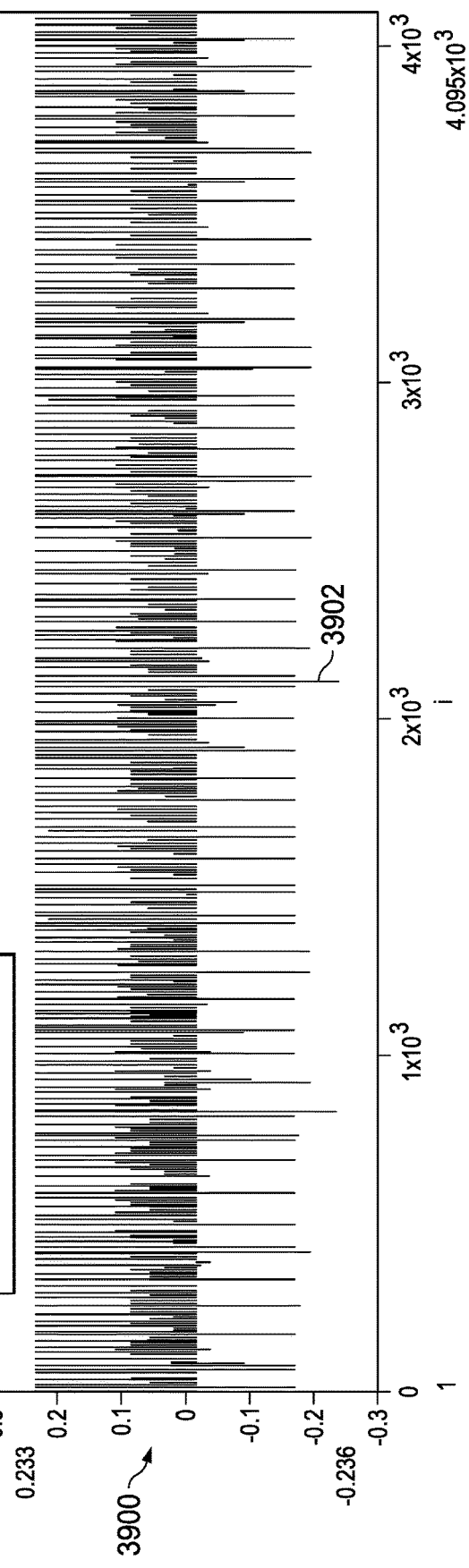
FIG. 39 is a graph of example differential nonlinearity (DNL) in the segmented DAC.
Figure 40:
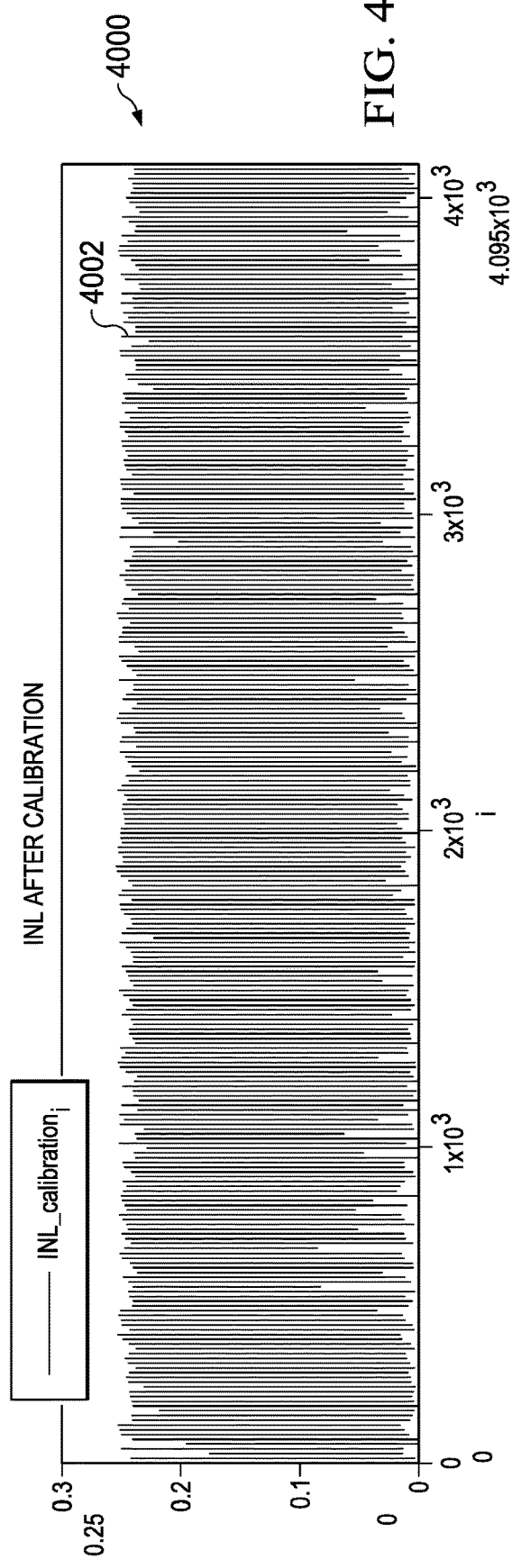
FIG. 40 is a graph of example integral nonlinearity (INL) in the segmented DAC.

Referring now to FIGS. 38-45, FIG. 38 provides a graph 3800 showing an example calibration code curve 3802 (CAL CODE) provided from the data output 132 of the calibration memory 108 (FIG. 1) for an example 8-bit first subword MSB provided to the first address input ADDR of the memory 108, and a 4-bit second subword ISB provided to the second address input ADDR2 of the memory 108. The curve 3802 illustrates the value of an example error code Error_code$_i$ in one example segmented DAC circuit 100. FIG. 39 provides a graph 3900 showing an example DNL curve 3902 after calibration of the segmented DAC 100. FIG. 40 shows a graph 4000 with a post-calibration INL curve 4002. Certain implementations provide INL and DNL performance within +/−1LSB over a calibration range with +/−¼ LSB calibration steps.

Figure 41:
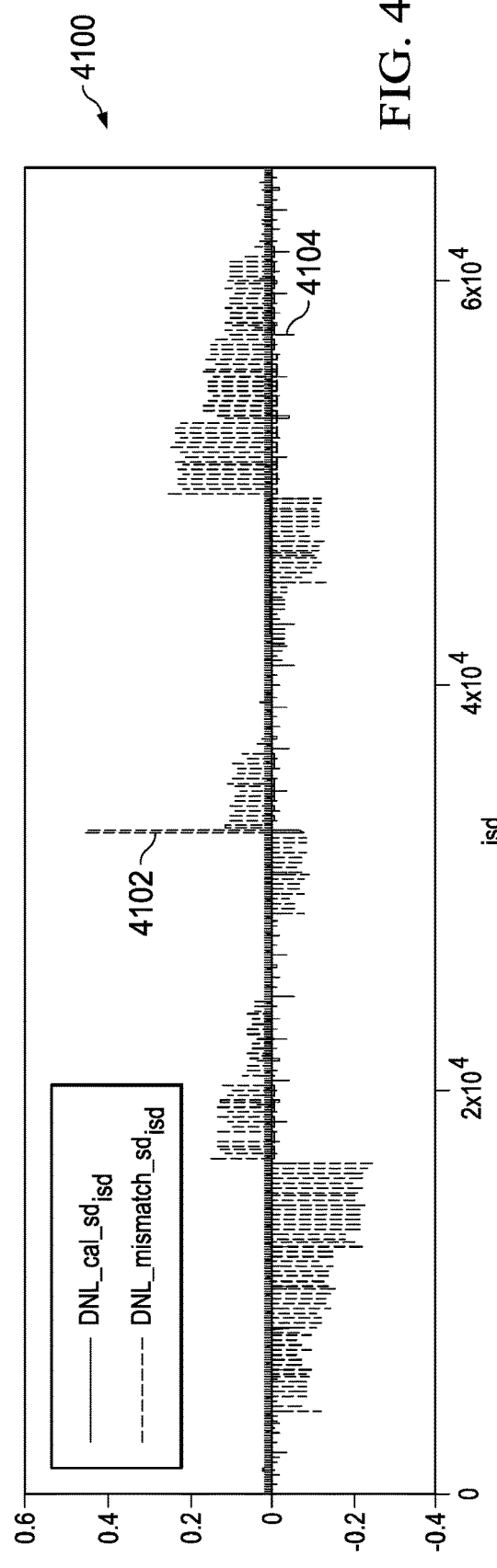
FIG. 41 is a graph of example resistor DAC DNL for an ideal resistor ladder and a mismatched resistor ladder without any resistor DAC chop function in the segmented DAC.
Figure 42:
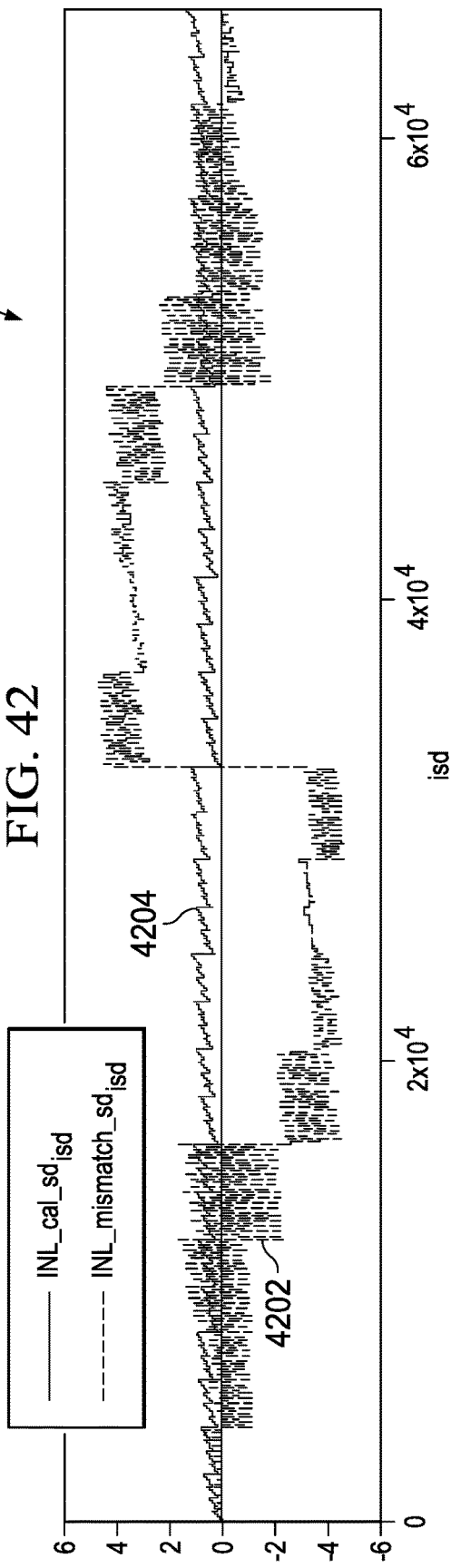
FIG. 42 is a graph of example resistor DAC INL for an ideal resistor ladder and a mismatched resistor ladder without any resistor DAC chop function in the segmented DAC.
Figure 43:
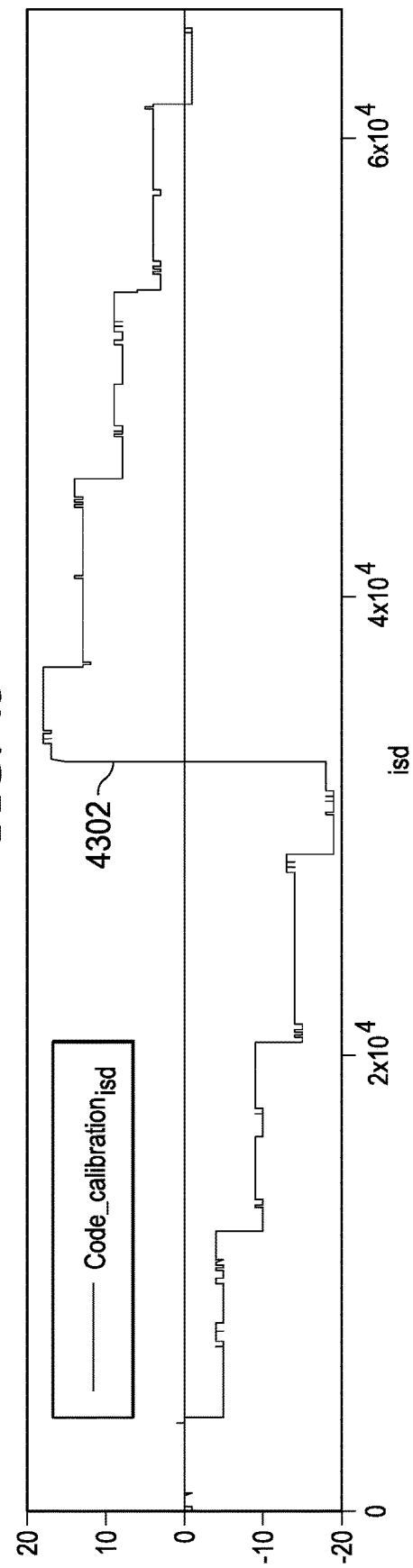
FIG. 43 is a graph of an example 16-bit DAC calibration code computed according to the method of FIG. 25.

FIGS. 41-45 further illustrate example linearity performance curves demonstrating the effect of the chopper functionality. FIG. 41 provides a graph 4100 showing a DNL curve 4102 for an example resistor DAC 120 that does not implement any chopper functionality for a resistive ladder circuit in the resistor DAC 120 having 1.5% mismatches, as well as a curve 4104 showing the performance for an ideal resistor ladder with no mismatches. FIG. 42 includes a graph 4200 with an INL curve 4202 for a resistor DAC resistive ladder circuit with 1.5% mismatches with no chopper functionality implemented. FIG. 42 also shows a curve 4204 for an ideal resistor ladder with no mismatches, and with no resistor DAC chopper functions. FIG. 43 provides a graph 4300 showing a curve 4302 representing an example 16-bit DAC calibration code computed according to the method of FIG. 25. The linearity improves with the addition of DAC chopper functionality, as shown in FIGS. 44 and 45. FIG. 44 provides a graph 4400 showing a DNL curve 4402 for an example resistor DAC 120 with chopper functionality for a resistive ladder circuit in the resistor DAC 120 having 1.5% mismatches, as well as a curve 4404 showing the performance for an ideal resistor ladder with no mismatches. FIG. 45 includes a graph 4500 with an INL curve 4502 for a resistor DAC resistive ladder circuit with 1.5% mismatches with chopper functionality.

The following Table 2 illustrates various comparative advantages over traditional calibration methods for segmented DAC systems. In particular, traditional calibration methods for a 16-bit system need more than 256×9-bits of calibration memory to do the MSB calibration with +/−32LSB range, ¼ LSB step, as well as 16×7-bits of memory to do the ISB calibration.

TABLE 2

| Architecture | 8-bit MSB + 4-bit ISB DAC + 4-bit LSB DAC (8-bit calibration) | |
|---|---|---|
| Calibration Method | Traditional Method | New Calibration Method |
| Total Test Point | 65536 points | 16 points MSB + 16 points ISB + 16 points LSB |
| Total Calibration Memory (max) | | 16 × 3 × 8 bits |
| Calibration Time | Around 1-1365 of traditional method | |

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A circuit comprising:
   a decoder having a binary-coded digital input, a most significant bit output, and a least significant bit output;
   a calibration memory having a first input, a second input, and a calibration code output, the first input of the calibration memory coupled to the most significant bit output of the decoder, and the second input of the calibration memory coupled to the least significant bit output of the decoder;
   a resistor digital-to-analog converter (DAC) having a first input, a second input, and an output, the first input of the resistor DAV coupled to the most significant bit output of the decoder; and
   a calibration circuit having a first input, a second input, and an output, the first input of the calibration circuit coupled to the output of the calibration memory, and the second input of the calibration circuit coupled to the least significant bit output of the decoder.

2. The circuit of claim 1, further comprising an interpolation DAC having a first input and a second input, the first input of the interpolation DAC is coupled to the output of the resistor DAC, and the second input is coupled to the output of the calibration circuit,
   wherein the decoder has a an intermediate bit output.

3. The circuit of claim 1, wherein the resistor DAC is a resistor-two-resistor (R-2R) DAC.

4. The circuit of claim 1, wherein the decoder has an intermediate significant bit output.

5. The circuit of claim 4, wherein the calibration memory has a third input and the calibration circuit has a third input, the third input of the calibration memory coupled to the intermediate significant bit output of the decoder, and the third input of the calibration circuit coupled to the intermediate significant bit output of the decoder.

6. The circuit of claim 1, wherein the resistor DAC further comprises:

a resistive chopper circuit, including a plurality of chopper resistors; and a chopper switching circuit.

7. The circuit of claim 1, wherein the resistor DAC is a matrix DAC, including the plurality of resistors configured in a matrix of resistors with a plurality of rows and a plurality of columns;

wherein a first set of the plurality of switches of the first switching circuit are configured in the matrix to selectively connect a corresponding one of the tap nodes with a corresponding column line of the matrix based on one of a first set of switching control signals along a corresponding row line of the matrix;

wherein a second set of the plurality of switches of the first switching circuit are configured in the matrix to selectively connect a corresponding one of the row lines to the first converter output based on a corresponding one of a set of second switching control signals;

wherein the resistor DAC further comprises:

a first decoder to provide the first set of switching control signals based on a most significant set of bits of a first subword, and a second decoder to provide the second set of switching control signals based on a least significant set of bits of the first subword.

* * * * *